US011232958B2

(12) United States Patent
Nulman et al.

(10) Patent No.: US 11,232,958 B2
(45) Date of Patent: Jan. 25, 2022

(54) SYSTEM AND METHOD FOR SELF-CLEANING WET TREATMENT PROCESS

(71) Applicant: VEECO INSTRUMENTS INC., Plainview, NY (US)

(72) Inventors: Kenji Michael Nulman, Plainview, NY (US); Mark Yannuzzi, Plainview, NY (US); Phillip Tyler, Plainview, NY (US); Jonathan Fijal, Plainview, NY (US); William Gilbert Breingan, Media, PA (US); John Taddei, Jim Thorpe, PA (US); Nicholas Baverov, Plainview, NY (US); James Swallow, Plainview, NY (US); Christopher Orlando, Media, PA (US); Paul Vit, Plainview, NY (US); Christopher Hofmeister, Plainview, NY (US); Tremayne Diggs, Plainview, NY (US)

(73) Assignee: VEECO INSTRUMENTS INC., Plainview, NY (US)

( * ) Notice: Subject to any disclaimer, the term of this patent is extended or adjusted under 35 U.S.C. 154(b) by 0 days.

(21) Appl. No.: 16/445,927

(22) Filed: Jun. 19, 2019

(65) Prior Publication Data
US 2020/0013641 A1 Jan. 9, 2020

Related U.S. Application Data
(60) Provisional application No. 62/687,643, filed on Jun. 20, 2018.

(51) Int. Cl.
H01L 21/67 (2006.01)
B08B 3/02 (2006.01)
(Continued)

(52) U.S. Cl.
CPC ........ *H01L 21/67057* (2013.01); *B08B 3/024* (2013.01); *B08B 3/10* (2013.01); *H01L 21/0206* (2013.01); *H01L 21/67051* (2013.01)

(58) Field of Classification Search
None
See application file for complete search history.

(56) References Cited

U.S. PATENT DOCUMENTS 4,722,355 A * 2/1988 Moe ................. G03F 7/422
134/103.2
6,491,570 B1 * 12/2002 Sommer ............ B24B 37/20
257/E21.23
(Continued)

FOREIGN PATENT DOCUMENTS

KR 20120040466 A * 4/2012
WO WO-03095115 A1 * 11/2003 ............ C23C 10/18
WO WO-2003095115 A1 11/2003

OTHER PUBLICATIONS

English Machine Translation of KR-20120040466-A.*
(Continued)

*Primary Examiner* — Mikhail Kornakov
*Assistant Examiner* — Pradhuman Parihar
(74) *Attorney, Agent, or Firm* — Leason Ellis LLP

(57) ABSTRACT

An apparatus for supporting and maneuvering a wafer comprises a handle having a gas inlet adapted to couple to a gas supply, a supporting surface coupled to the handle section including a frame structure having edge segments connecting at vertices and spoke elements extending from a center of the frame structure to the vertices, a gas supply channel coupled to the gas inlet that extends from the handle and branches into channels that run through the spoke elements, and a plurality of nozzles positioned at the vertices on the supporting surface and coupled to the channels in the spoke elements. Gas provided to the plurality of nozzles
(Continued)

exits the nozzles in a stream directed parallel to the supporting surface and the stream of gas generates forces that enable wafers to be securely supported in a floating manner over the supporting surface without coming into direct contact with the supporting surface.

26 Claims, 22 Drawing Sheets

(51) Int. Cl.
*B08B 3/10* (2006.01)
*H01L 21/02* (2006.01)

(56) References Cited

U.S. PATENT DOCUMENTS

| | | | | |
|---|---|---|---|---|
| 6,514,355 | B1* | 2/2003 | Betancourt | H01L 21/67086 134/10 |
| 2003/0205559 | A1* | 11/2003 | Hansen | H01L 21/67028 216/108 |
| 2004/0074600 | A1* | 4/2004 | Jang | H01L 21/67086 156/345.18 |
| 2006/0033678 | A1* | 2/2006 | Lubomirsky | H01L 21/67745 345/32 |
| 2006/0112979 | A1* | 6/2006 | Kim | H01L 21/6708 134/94.1 |
| 2007/0200377 | A1* | 8/2007 | Nishio | B25J 15/0616 294/188 |
| 2013/0008470 | A1* | 1/2013 | Dobashi | H01L 21/31133 134/21 |
| 2014/0377951 | A1* | 12/2014 | Taddei | G03F 7/425 438/670 |
| 2015/0064910 | A1* | 3/2015 | Kaneko | B05B 7/00 438/694 |
| 2016/0086810 | A1* | 3/2016 | Fujiwara | H01L 21/6704 438/748 |
| 2018/0282892 | A1* | 10/2018 | Fujikata | C25D 5/022 |

OTHER PUBLICATIONS

International Search Report and Written Opinion in corresponding PCT Application No. PCT/US2019/037961, dated Sep. 16, 2019. 11 pages.

* cited by examiner

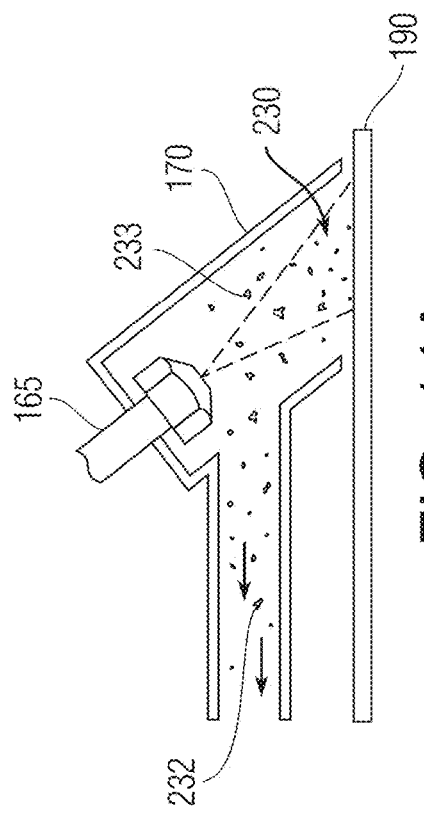
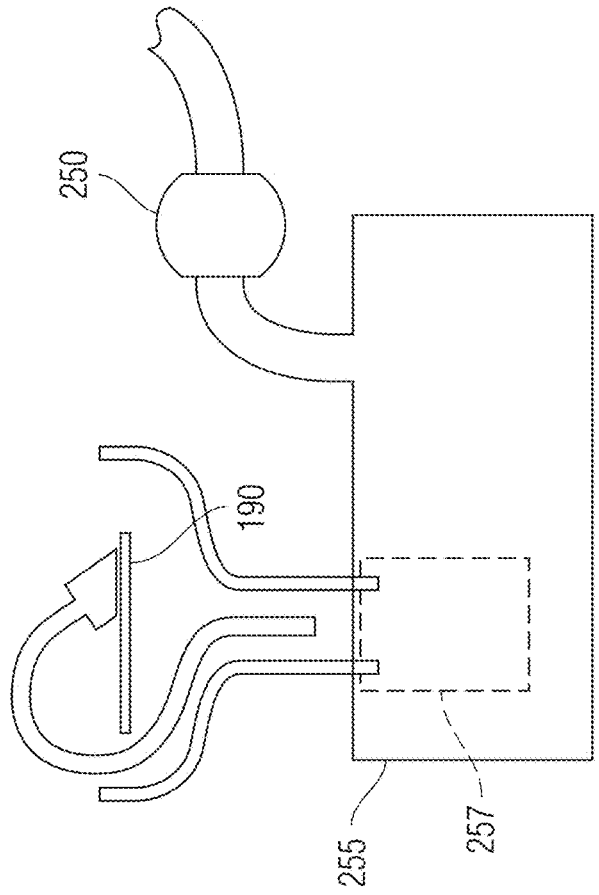
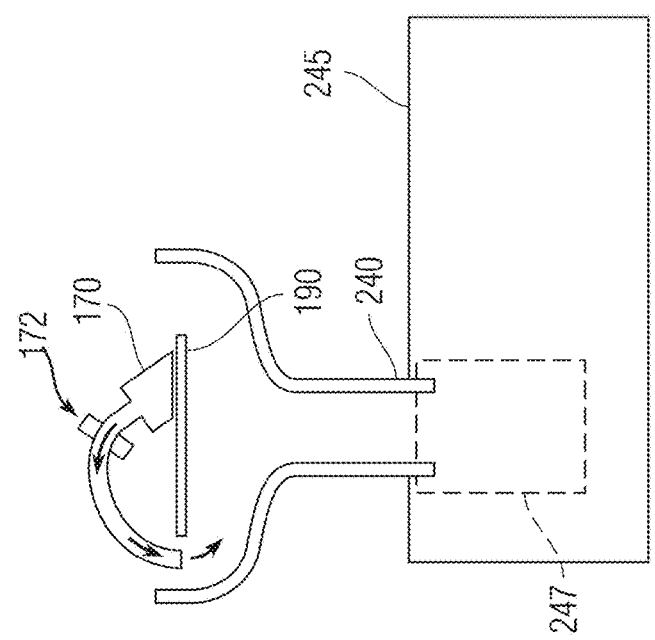

SYSTEM AND METHOD FOR SELF-CLEANING WET TREATMENT PROCESS

CROSS REFERENCE TO RELATED APPLICATION

The present application claims priority to and the benefit of U.S. patent application Ser. No. 62/687,643, filed Jun. 20, 2018, which is hereby expressly incorporated by reference in its entirety.

FIELD OF THE INVENTION

The present invention relates to semiconductor fabrication equipment and processing, and in particular, relates to a system and method for removing residues from processing equipment used in a wet treatment process, including solvent immersion and film lift-off stations.

BACKGROUND OF THE INVENTION

Semiconductor fabrication typically involves deposition of a mask or pattern which determines the components and the electrical connections on a substrate. One common masking technique involves depositing photoresist across a substrate surface and then selectively exposing a pattern on the photoresist. During wet treatment, the pattern is etched onto the substrate material by removal of the exposed sections (or alternatively by sections that were not exposed, depending on the type of photoresist). By chemical development both exposed photoresist and material underlying the exposed photoresist can then be chemically removed by immersion in a solvent, resulting in a patterned structure.

To accommodate fabrication on substrates that are harder to remove by conventional solvent immersion, such as Gallium Arsenide (GaAs), photoresist can be deposited first, underneath subsequently deposited material that is harder to dissolve. When solvent is applied, the photoresist dissolves and layers overlying the photoresist can be removed, or lifted-off, as well. During both the immersion phase and subsequent lift-off phase, a considerable amount of debris and residue can accumulate. Additionally, during immersion incompletely dissolved materials build-up in the solvent bath and can also remain on the meniscus on the wafer surface.

After immersion, the wafer is typically transferred to a spin chamber in which a high-pressure spray is applied to remove excess material and residual photoresist from the wafer. The residual debris tends to accumulate rapidly on walls of the spin chamber or in filters positioned in the fluid drain path, necessitating frequent cleaning of the spin chamber (e.g., several times per day). The time that the chambers spend offline reduces wafer throughput and the overall efficiency of the fabrication process. Furthermore, the high-pressure spray can damage the wafer surface as any adhering or trapped debris is dragged along by surface by the force of the spray.

It would therefore be advantageous to adapt the semiconductor fabrication process to meet these challenges caused by the accumulation of residual resist and other dislodged material.

It is with respect to these and other considerations that the disclosure made herein is presented.

SUMMARY OF THE INVENTION

Embodiments of a semiconductor processing system according to the present invention comprise a self-cleaning immersion station adapted for immersion a wafer in solvent for removal of material. The immersion station includes a first sprayer having a plurality of nozzles positioned to spray the wafer as it is transferred out of the immersion station, and a self-cleaning assembly adapted to spray cleaning fluid on internal surfaces of the immersion station. The processing system also includes a self-cleaning lift-off station adapted to completely remove material from the surface of the wafer. The lift-off station includes a) a vacuum-assisted separator adapted to spray solvent at a high pressure spray onto the wafer surface while applying suction in the vicinity of the sprayed wafer surface to capture material dislodged by the spray, and b) at least one cleaning sprayer adapted to clean internal surfaces of the lift-off station.

In certain embodiments, the vacuum-assisted separator of the self-cleaning lift-off station includes a suction head having a Venturi body for generating suction. In alternative embodiment, the vacuum-assisted separator of the self-cleaning lift-off station includes a suction head coupled to a blower located distally from the separator.

The self-cleaning immersion station may include an upper housing having a door through which wafers are received, and a solvent tank coupled to a bottom of the upper housing. The self-cleaning assembly may include a plurality of fan nozzles positioned within the solvent tank and adapted to direct wide-angle sprays of cleaning fluid onto internal surfaces of the tank.

In certain embodiments, the at least one cleaning sprayer of the lift-off station includes an overhead shower spray, and nozzle manifolds positioned on side walls of the lift-off station. In some implementations, the at least one cleaning sprayer further comprises a pivotable sprayer with a rotating spray head, the rotating spray head covering a full 360 degrees of rotation.

Embodiments of the present invention also provide a method of semiconductor processing that comprises soaking a semiconductor wafer in a solvent bath within an immersion station to loosen a resist layer on the wafer, spraying an entire surface of the semiconductor wafer after removing the wafer from the solvent bath to remove suspended particles and solvent from the surface of the wafer, and spraying internal surfaces of the solvent tank using a plurality of spray nozzles located within the solvent tank.

In certain embodiments, the method of semiconductor processing further comprises transferring the wafer from the immersion station to a lift-off station having a chamber, applying a high-pressure spray to the surface of the wafer to dislodge the resist layer and material overlying the resist, applying suction near to the surface of the wafer to capture dislodged material in a suction stream, and removing the captured material from the chamber of the lift-off station. The method may include spraying internal surfaces of the lift-off chamber using at least one sprayer positioned inside the chamber. The at least one sprayer may include an overhead sprayer, a plurality of side sprayers, and rotating sprayer.

These and other aspects, features, and advantages can be appreciated from the following description of certain embodiments of the invention and the accompanying drawing figures and claims.

BRIEF DESCRIPTION OF THE DRAWINGS

FIG. 14A is a magnified schematic illustration of how the vacuum-assisted separator aids in drawing debris from the wafer surface into a suction path.

FIG. 14B is a schematic illustration of debris removal using a vacuum-assisted separator that employs a Venturi body.

FIG. 14C is a schematic illustration of debris removal using a vacuum-assisted separator that employs a blower to generate suction.

DETAILED DESCRIPTION OF CERTAIN EMBODIMENTS OF THE INVENTION

Embodiments of the present invention provide a system and method for removing debris from processing chambers during semiconductor fabrication. In particular, embodiments of the present invention include a self-cleaning immersion station that includes sets of sprayers for both cleaning the internal surfaces of the station chamber, and for spraying wafers as they are transferred out of the immersion station to remove suspended debris adhering to the wafer surface. Embodiments of the present invention also include a self-cleaning lift-off station that includes several types of sprays for cleaning residual debris and solvent from the internal surfaces of the lift-off station chamber, and a vacuum-assisted separator that draws of lift-off material into a suction path as the material is forcibly dislodged from the wafer surface by a high-pressure spray. Collectively, the sprayers and other devices that are added to the immersion and lift-off stations prevent the rapid build-up of debris within the chambers and dramatically reduce the frequency with which the stations need to be brought off-line for cleaning and maintenance.

Figure 1:
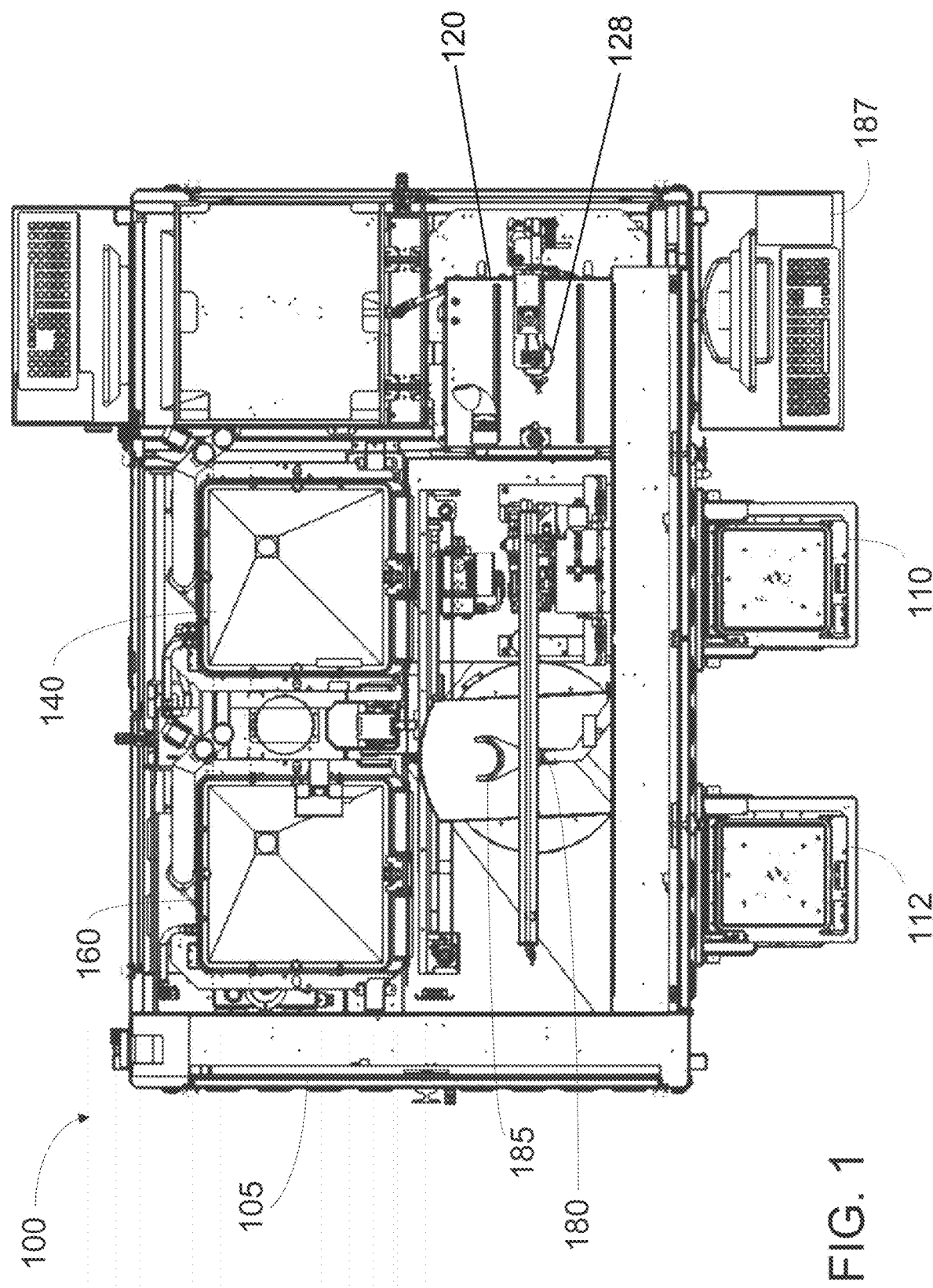
FIG. 1 is a top plan view of an integrated wet treatment system including self-cleaning features according to an embodiment of the present invention.

FIG. 1 is a top plan view of an integrated wet treatment processing system 100 according to an embodiment of the present invention. The integrated system contains load ports for receiving and outputting wafer substrates into and out of the system. Within the system are disposed a number of stations or chambers in which specific processes are performed on wafer substrates. Typically, the wafers are processed by in a particular order, starting, for example, with immersion in a first chamber, followed by metal lift-off in a second chamber, and drying in a third chamber. A robot arm transfers wafers between the stations of the integrated system. More specifically, in FIG. 1, an integrated wet processing system 100 includes a rectangular enclosure 105 that houses several processing stations. Load port 110 is adapted to receive cassettes housing one or more semiconductor wafers from other parts of the fabrication facility. Load port 112, situated on the same side of the enclosure, is adapted to receive cassettes including wafers that have been processed and are ready to be transferred out of the system 100. Alternatively, the wafers can be returned to the same cassette.

Integrated system 100 includes a number of processing stations arranged within the enclosure 105 including an immersion station 120 adapted for soaking wafers in a solvent bath to loosen resist layers, metal layers, or any suitable layers; a lift-off station 140 adapted to remove residual resist and overlying metallic films from the wafer; and a rinse dry station 160 adapted for removing any remaining solvent or other fluids from the wafer surface. A robot arm 180 is adapted to securely hold and move individual wafers between the processing stations and the cassettes. In some embodiments, the robot arm includes a paddle 185 that is supplied with a Venturi vacuum stream. The vacuum stream enables a wafer to be secured in relation to the paddle without direct contact between the wafer and the paddle surface, preventing damage to the wafer surface.

The integrated system 100 may also include one or more user control units, e.g., 187 that allow process engineers to set various parameters of the system, such as length of immersion time, and spray pressure, among numerous other control parameters.

Figure 2:
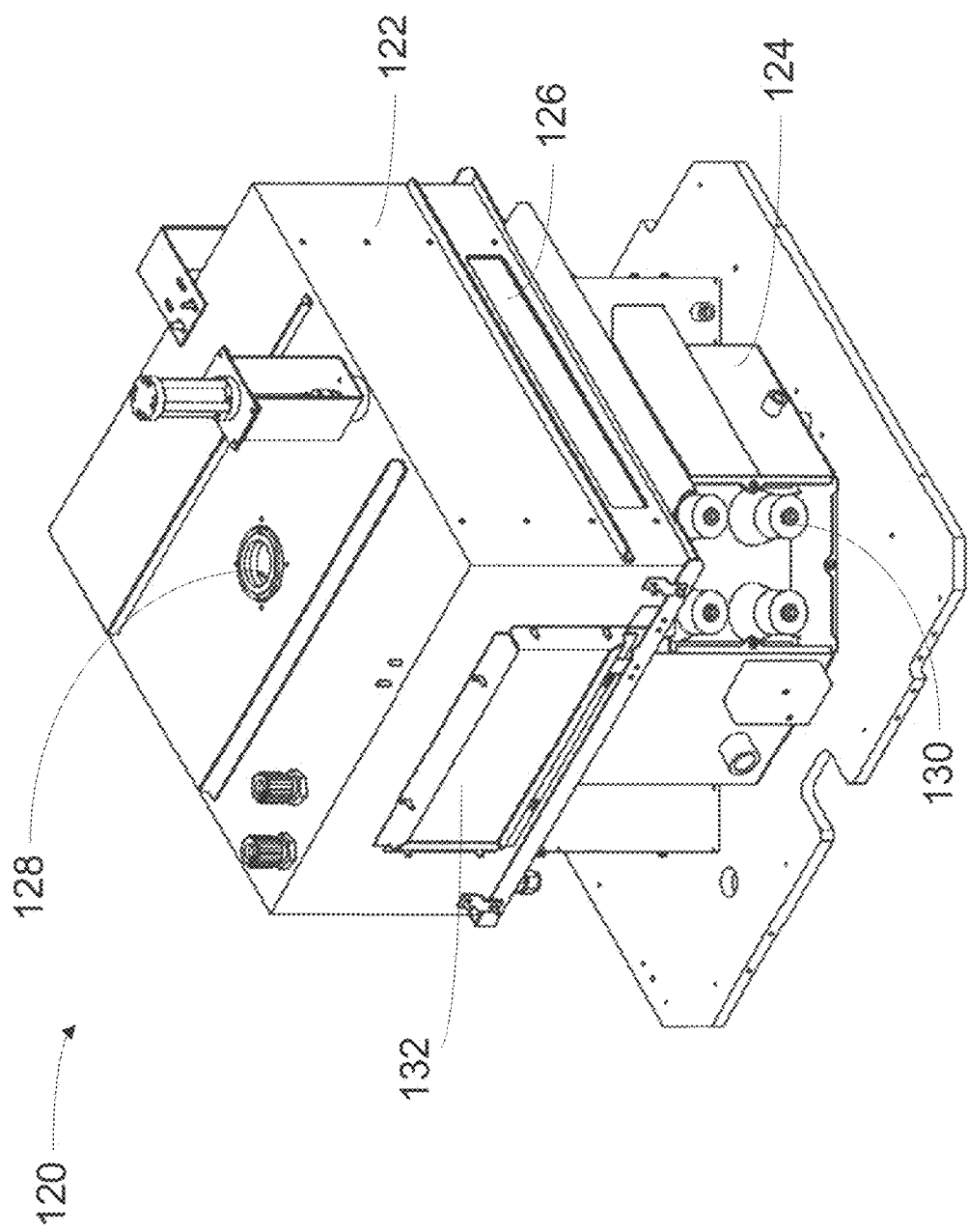
FIG. 2 is a perspective view of a self-cleaning immersion station according to an embodiment of the present invention.

FIG. 2 is a perspective view of an immersion station 120 according to an embodiment of the present invention. The immersion station 120 includes a generally rectangular upper housing 122 enclosing an immersion chamber. Below the upper housing 122 is a tank 124 in which a solvent bath is maintained. The solvent bath stored in the tank 124 may include one or more solvents which are used in semiconductor processing. The housing 122 includes a door 126 through which individual wafers can be transferred into and out of the station. Within the immersion station 120, the wafers are received in cassettes (not shown in FIG. 2) that secure the wafers. The internal cassettes can be moved vertically via a cassette Z-drive 128 (See, FIG. 1) (which may include rods, interconnectors and other components not shown) to move the cassette downward to soak the wafer in tank 124, and to lift the cassettes out of the tank after immersion. Ultrasonic actuators 130 may be coupled to the tank 124 for vibrating the solvent bath, which helps force solvent though the small openings in the photoresist layers, aiding in the dissolving of photoresist material. The enclosure 122 can also include a view port 132 for allowing process engineers to monitor the immersion process.

Figure 3:
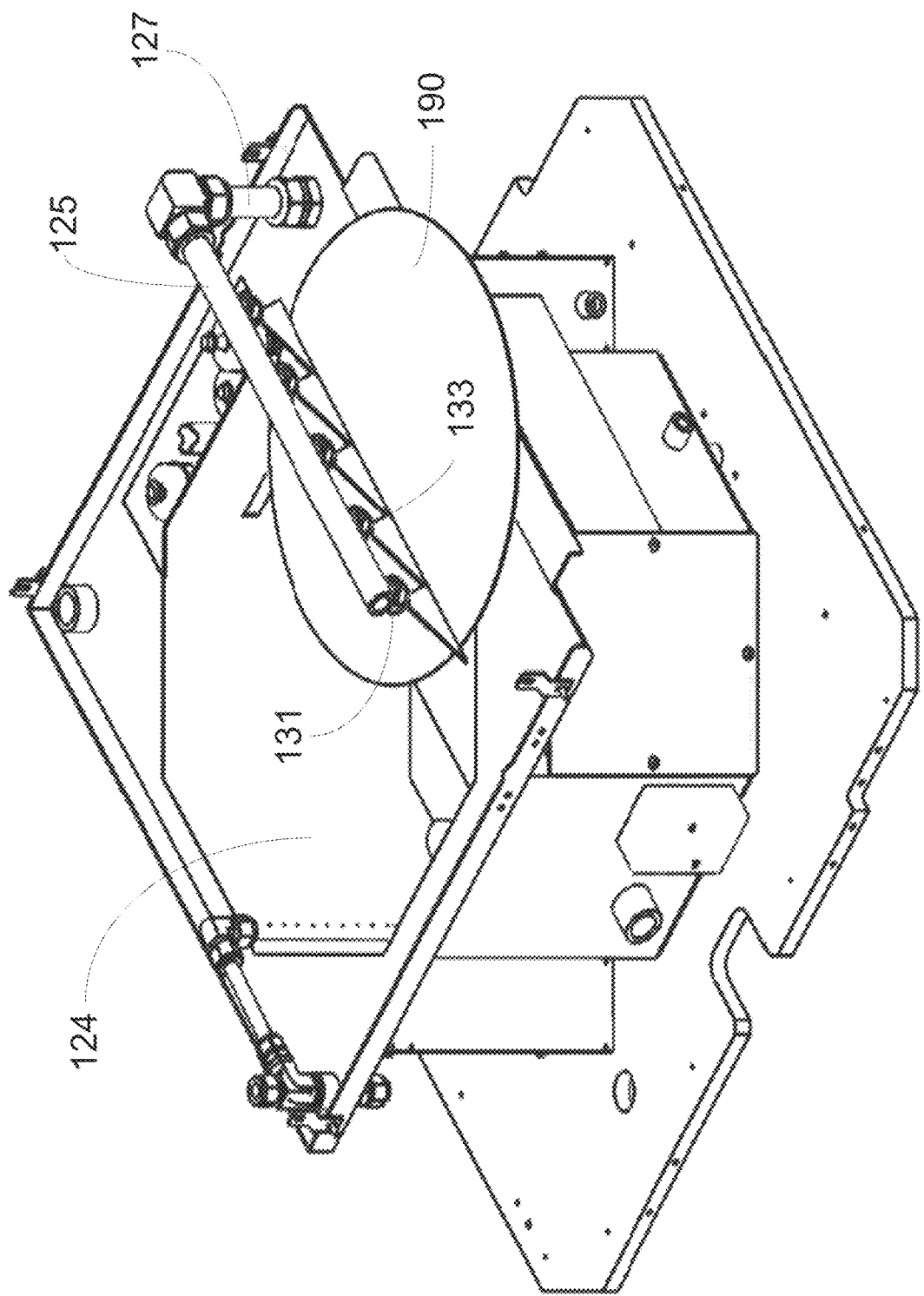
FIG. 3 is a perspective view of a self-cleaning immersion station according to an embodiment of the present invention. In the view, the top portion of the housing has been removed.

FIG. 3 is a perspective view of an embodiment of the self-cleaning immersion station 120 according to an embodiment of the present invention with the top portion of the enclosure removed. As shown, station 120 includes a spray bar 125 coupled to the housing via a pivotable coupling 127. The pivotable coupling 127 can be positioned near to and/or on the side of the housing near to the door 126 (FIG. 2) of the immersion station (not explicitly shown in FIG. 3) The spray bar includes 125 is coupled to a plurality of nozzles, e.g., 131, 133 that are adapted to spray cleaning fluid at a selected pressure onto a wafer 190 after the wafer has been lifted from the solvent tank 124 and is being removed from the immersion station after a soaking process. The nozzles 131, 133 are distributed over the majority of the length of the spray bar 125 to cover the entire width of the substrate with spray to remove material from the surface of the wafer. The spray bar 125 can also be rotated via the pivotable coupling 127 fixed or movable at a selective speed provide to vary the distribution of spray. Depending on the residual material and device structure the pressure can range from a light liquid dispense of about 1 to 10 psi, to a medium pressure of about 50 to about 150 psi, to a high-pressure spray of about 2500 to about 3500 psi. Material or residual small particles (e.g., under 25 μm) suspended in the solvent that adhere to the wafer surface are removed by the spray. In addition to dislodging adhering particles, the spray can contribute solvent for replacing fluid that is often lost from the bath due to transfer or evaporation. A variety of different types of nozzles can be used in the spray bar, including, but not limited to fan, cone, and fan and needle nozzles. The spray type, pressure, flow rate and temperature are controllable parameters that can be set based on a specific processing recipe.

Figure 4C:
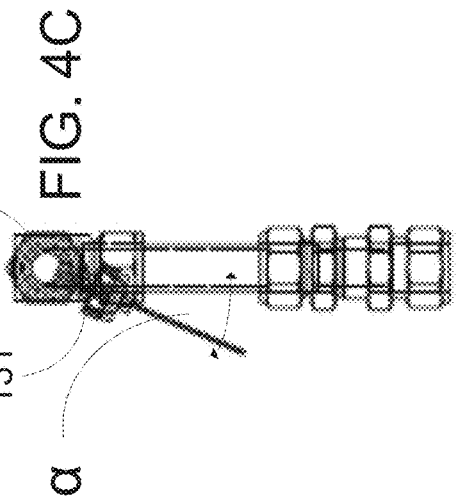
FIGS. 4A, 4B and 4C are side, perspective and end views of an embodiment of a spray bar with nozzles for an immersion station according to an embodiment of the present invention.
Figure 4A:
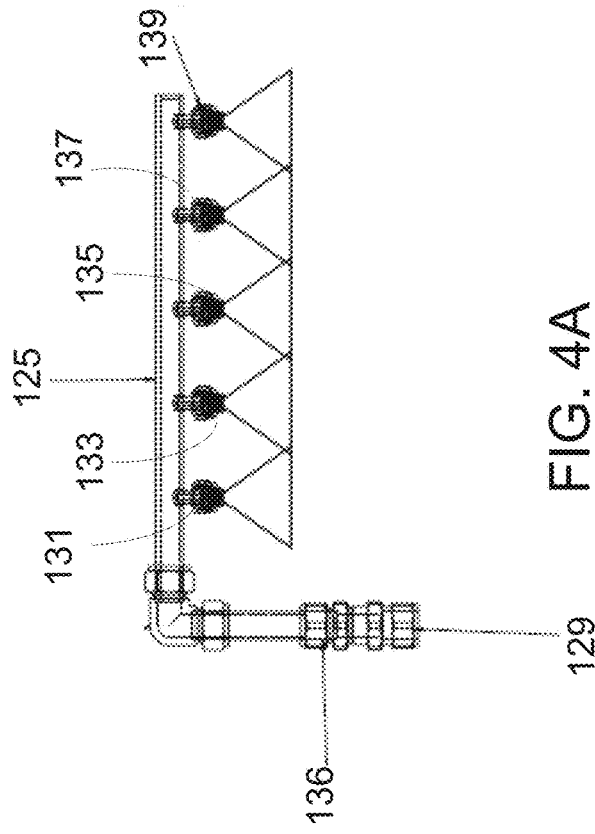
Figure 4B:
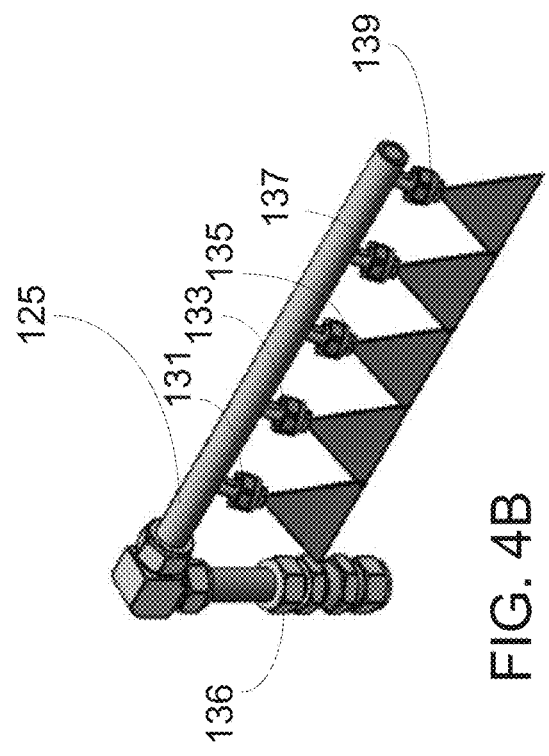

FIGS. 4A, 4B and 4C illustrate side, perspective and end views of an embodiment of the spray bar 125 according to the present invention. FIG. 4A, shows a spray bar 125 including five nozzles 131, 133, 135, 137, 139 arranged linearly along the length of the spray bar. In the embodiment depicted, nozzles 131, 133, 135, 137, 139 are fan nozzles that direct a spray in a diverging, fan-like manner. As noted above, in other embodiments, other combinations of nozzle types can be used. As shown more clearly in FIGS. 4B and 4C, the nozzles 131-139 can pivot within an angular range ($\alpha$) with respect to a vertical axis. The pivoting aids the dislodging of material as a component of the force of the spray is directed horizontally, providing a shearing action to remove residual debris. The spray bar has 125 an internal fluid conduit and is coupled to an inlet 129 through which pressurized solvent is supplied through the conduit to the nozzles 131-139. In other embodiments, the spray bar 125 can include more than one inlet for delivering different fluids (e.g., solvent, water or otherwise). The height of the spray bar 125 can be adjusted using an adjustable fastener such as a locking nut 136.

Figure 5A:
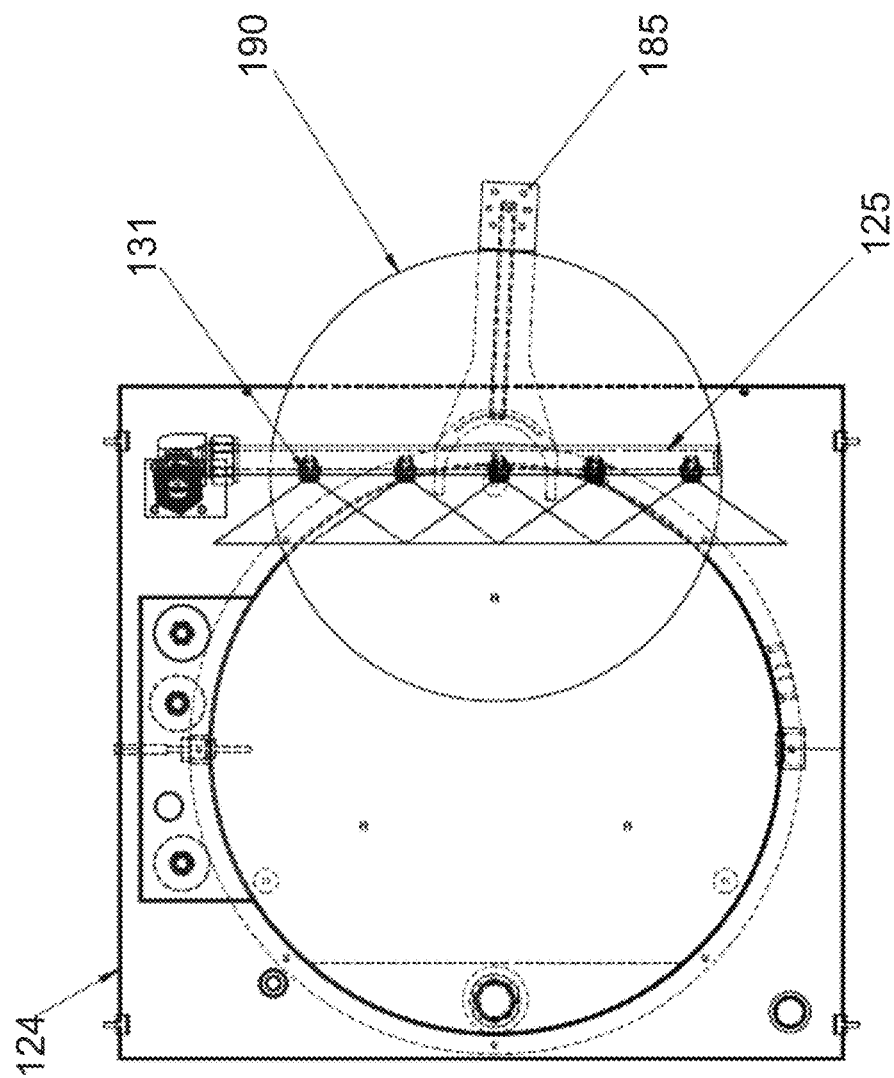
FIGS. 5A and 5B are top plan view and side views depicting a wafer in the process being removed from the immersion station according to an embodiment of the present invention.
Figure 5B:
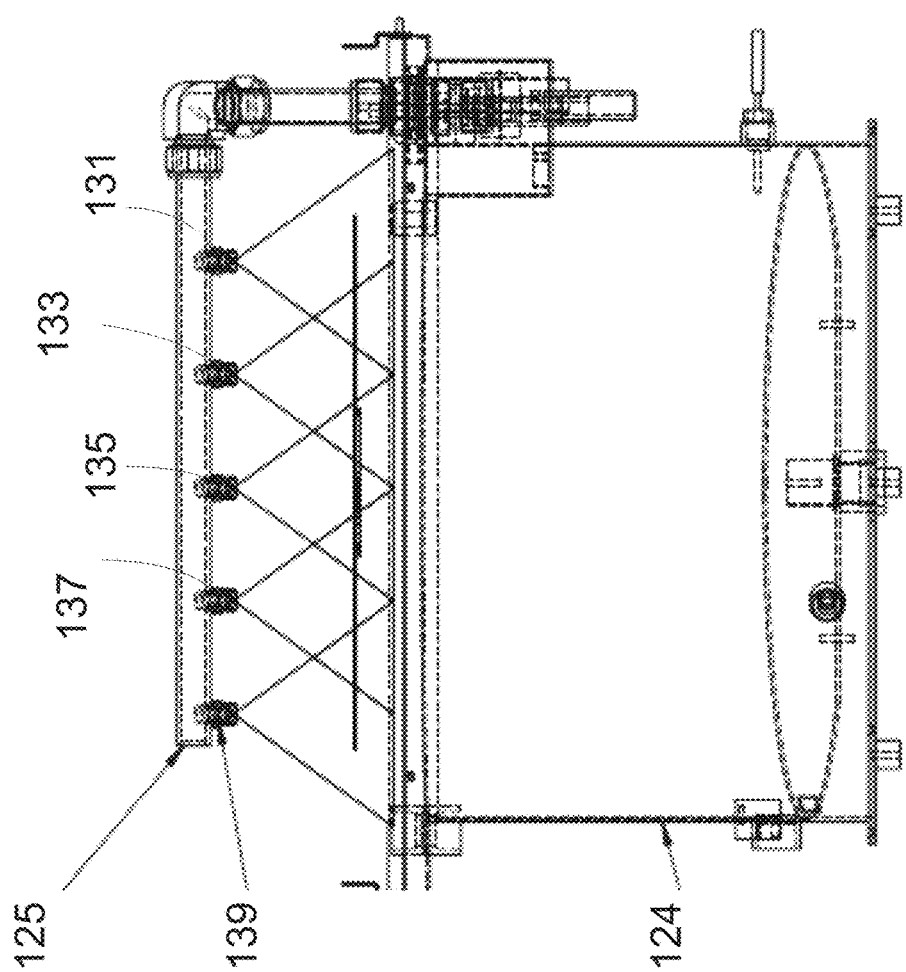

FIG. 5A is a top plan view and FIG. 5B is a side view depicting a wafer 190 in the process being removed from the immersion station 120 after having been released from the holding cassette by a handler (not shown). Paddle 185 is shown supporting the wafer from underneath as the wafer is transferred. The extraction of the wafer occurs directly under the spray bar so that the plurality of nozzles 131-139 can direct maximal spray onto the wafer surface for dislodging adhered solids and to rinse contaminated, debris-filled solvent from the wafer.

Figure 6A:
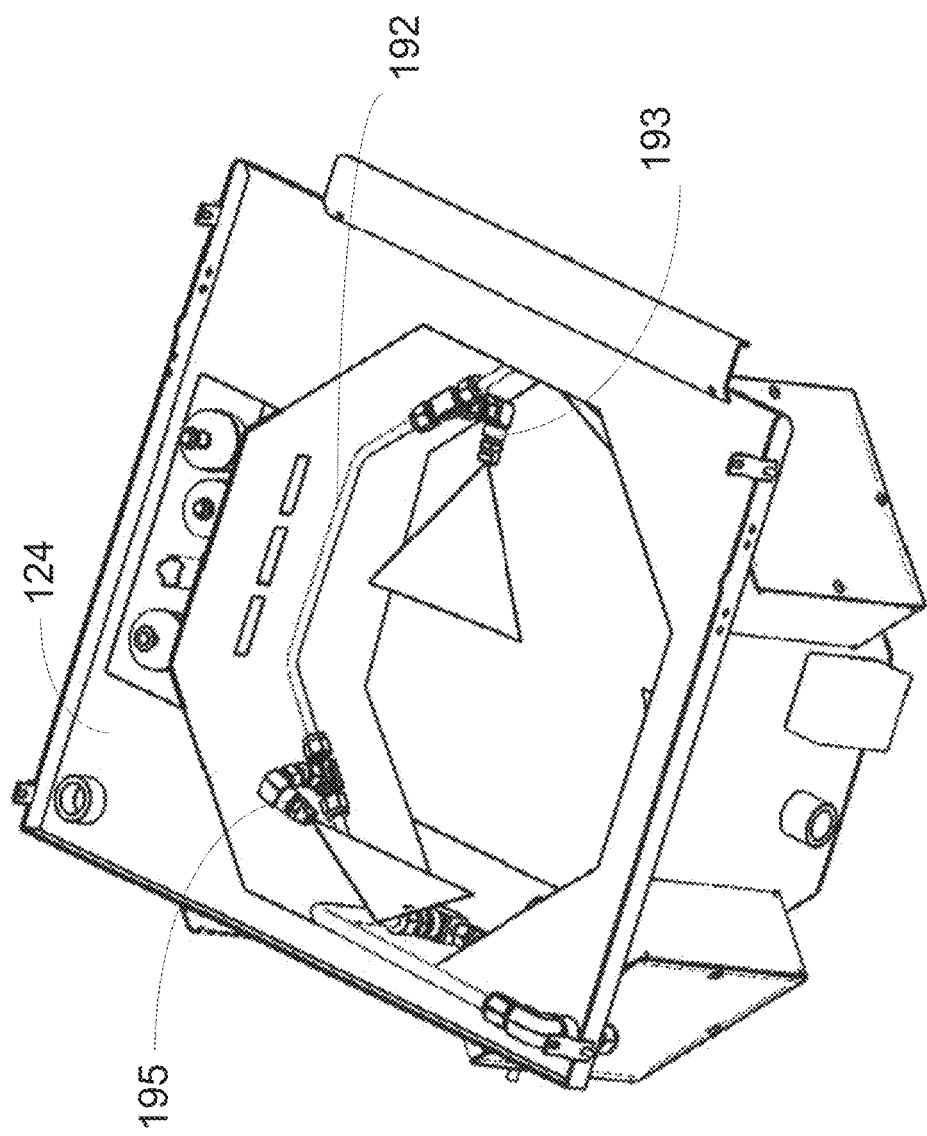
FIG. 6A is top perspective view of a self-cleaning immersion station according to an embodiment of the present invention with the upper housing removed.
Figure 6B:
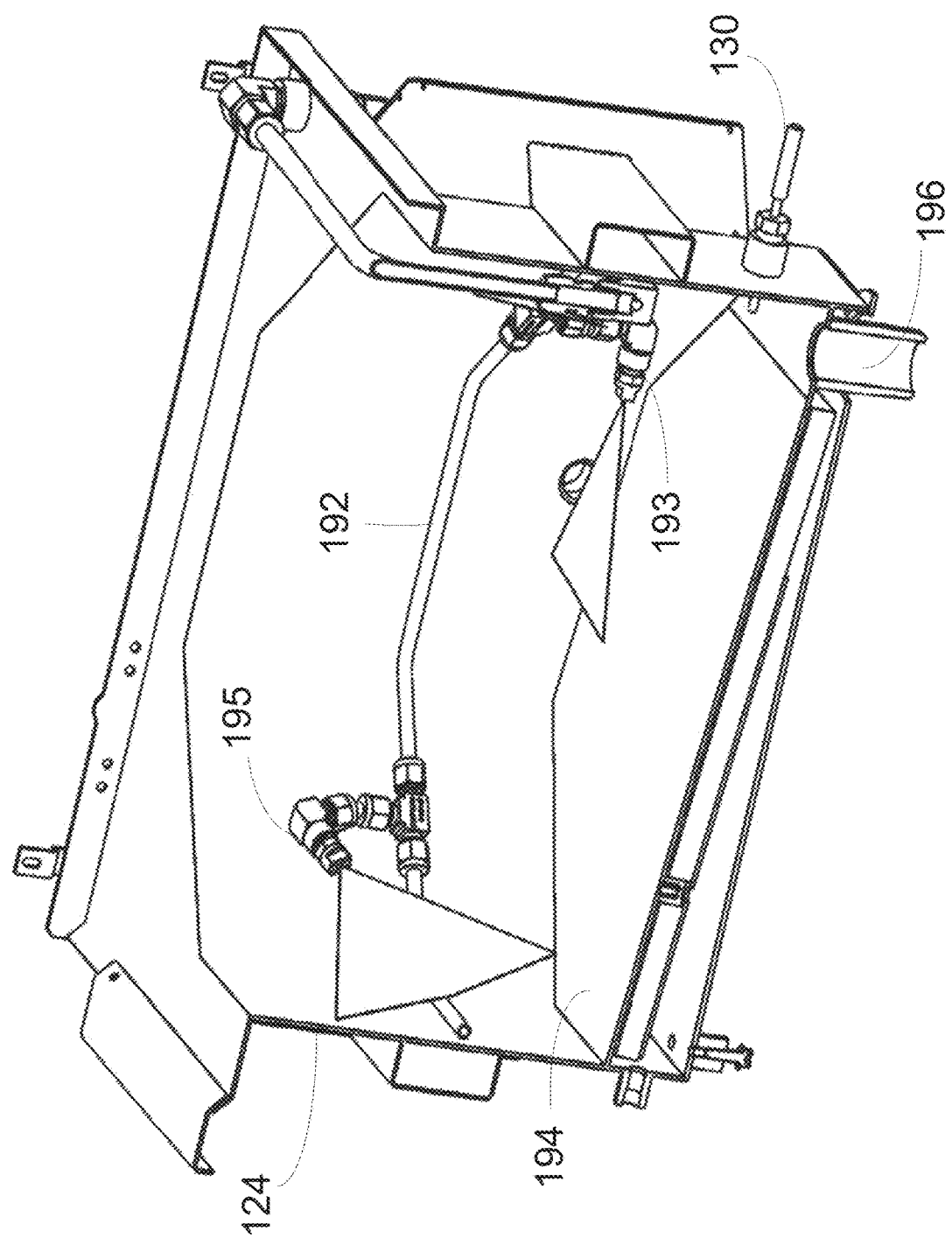
FIG. 6B is a cut-away side perspective view of an embodiment of a self-cleaning immersion station according to an embodiment of the present invention
Figure 6C:
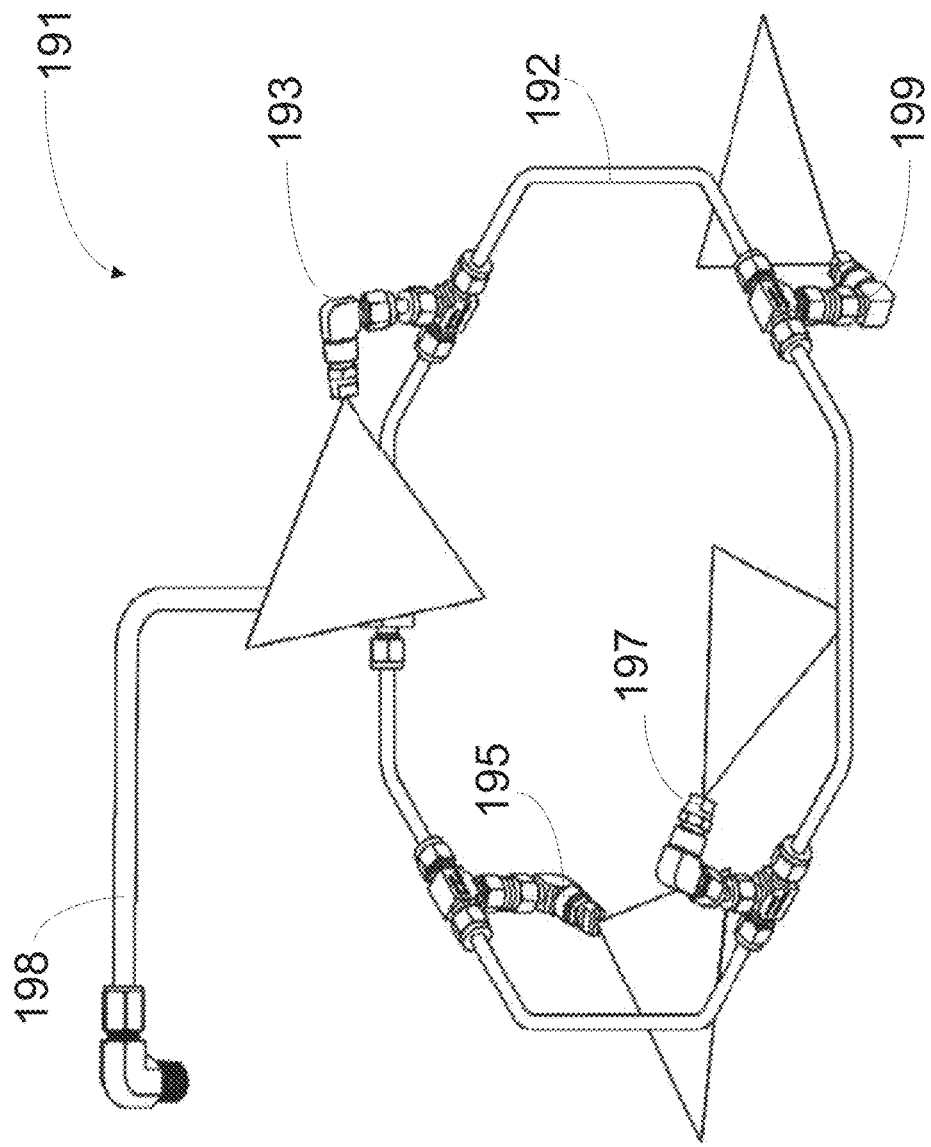
FIG. 6C is a perspective view of a self-cleaning assembly for an immersion station according to an embodiment of the present invention.

FIGS. 6A, 6B and 6C illustrate an embodiment of an immersion tank having a tank rinse assembly for self-cleaning according to the present invention. FIG. 6A is a perspective top view of an immersion station with the upper housing removed and shows a cleaning fluid delivery tube 192 that extends circumferentially around the inner perimeter of the tank 124. A plurality of nozzles e.g., 193, 195 are attached to, and receive fluid from, the delivery tube 192. The delivery tube 192 is coupled to a cleaning fluid supply source (not shown). Nozzles 193, 195 which may be, but are not limited to, fan nozzles as shown, direct a pressurized cleaning spray onto the inner walls of the tank 124 and also toward the solvent bath held within the tank. With respect to debris that adheres to the tank, the sprayed cleaning fluid dislodges the particles from the wall and/or into the solvent bath. Alternatively, the nozzles can be arranged to direct the particles along the floor and into the drain. In some cases, for example when a small number of nozzles are employed, it may be preferable to use fan nozzles which emit a wide-angle to cover the inner surfaces of the tank with cleaning fluid.

Referring to the cut-away side view of FIG. 6B, the spray from nozzles 193, 195 is directed toward the solvent bath and agitates the chemicals and suspended debris within the bath. The agitation helps break larger debris particles into smaller particles which are able to pass through filters positioned in the drain path 196 and exit from the immersion station. The bottom surface of the tank 194 can be sloped to facilitate movement of particles coming out of suspension toward drain path 196. The agitation of the solvent bath can also aided by the one or more ultrasonic actuators 130 which induce ultrasonic vibrations via one or more walls of the tank, as shown in FIG. 6B.

FIG. 6C is a perspective view of the self-cleaning assembly 191 shown by itself. A cleaning fluid inlet 198 feeds fluid to the tube 192, which runs circumferentially in a form that follows the inner contour of the tank, which in the depicted case is octagonal. In contrast to the cut-away views shown in FIGS. 6A and 6B, FIG. 6C shows the entire track of the tube with four equally-spaced nozzles 193, 195, 197, 199 positioned to direct wide-angle sprays onto the inner surfaces of the tank and the surface of the solvent bath. It should be appreciated that the tube can be configured differently, for example, in a circular shape.

Figure 7:
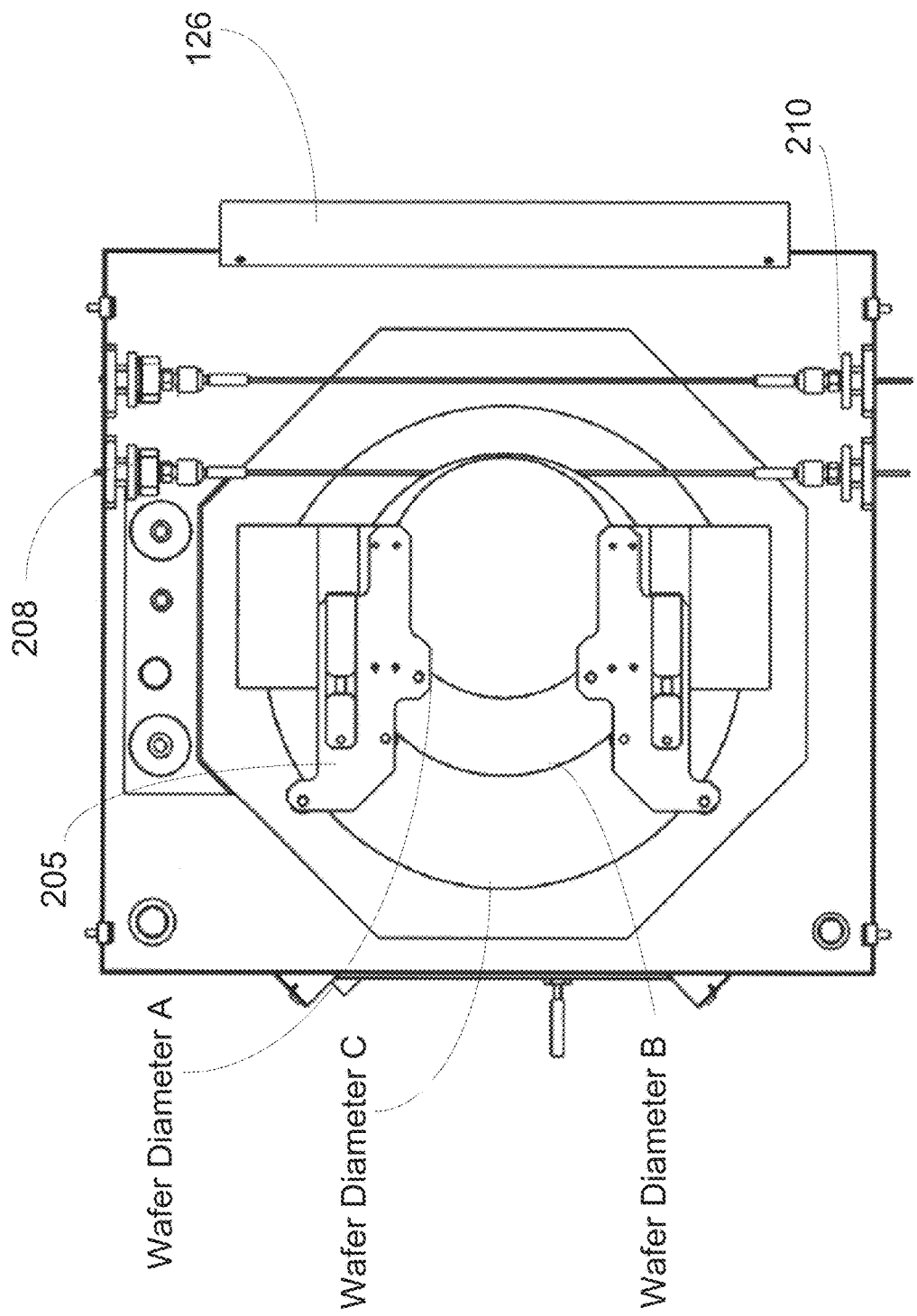
FIG. 7 is a cut-away top view of an embodiment of the immersion station that includes through-beam sensors for determining the position of wafers held within and/or moving out of the immersion tank.

FIG. 7 illustrates a cut-away top view of an embodiment of the immersion station 120 that includes through-beam sensors for determining the position of wafers held within the immersion tank, and for determining whether a wafer has been moved toward the door of the immersion station for transfer. As shown, wafers of a variety of diameters (diameters A, B and C) are shown positioned in an immersion tank 124 and confined within a secure by a wafer cassette 205. The wafer cassette 205 contacts and supports the edges of the wafer such that the robot arm can transfer wafers into and out of the immersion station. A first sensor 208, which may comprise a laser beam emitter (e.g., infrared or visible) positioned on one side of tank and a laser detector positioned on the opposite side, is positioned to intersect the wafers and provides a signal for determining the wafer presence and position according to the timing or position at which the laser beam is reflected or blocked. Sensor 208 is blocked by the wafer as the cassette is indexed allowing the cassette to be mapped. A second sensor 210 is positioned near to but further from the center of the tank towards the door 126 of the immersion station. The second sensor 210 may also comprise a laser beam emitter and detector positioned on opposite sides of the tank. The second sensor is positioned to detect a wafer that has been shifted toward the door by the handler or otherwise. When the laser beam of the second sensor 210 is blocked by a wafer, it is determined that the wafer is moved or slid out such that an error is detected before door 126 is closed.

Figure 8:
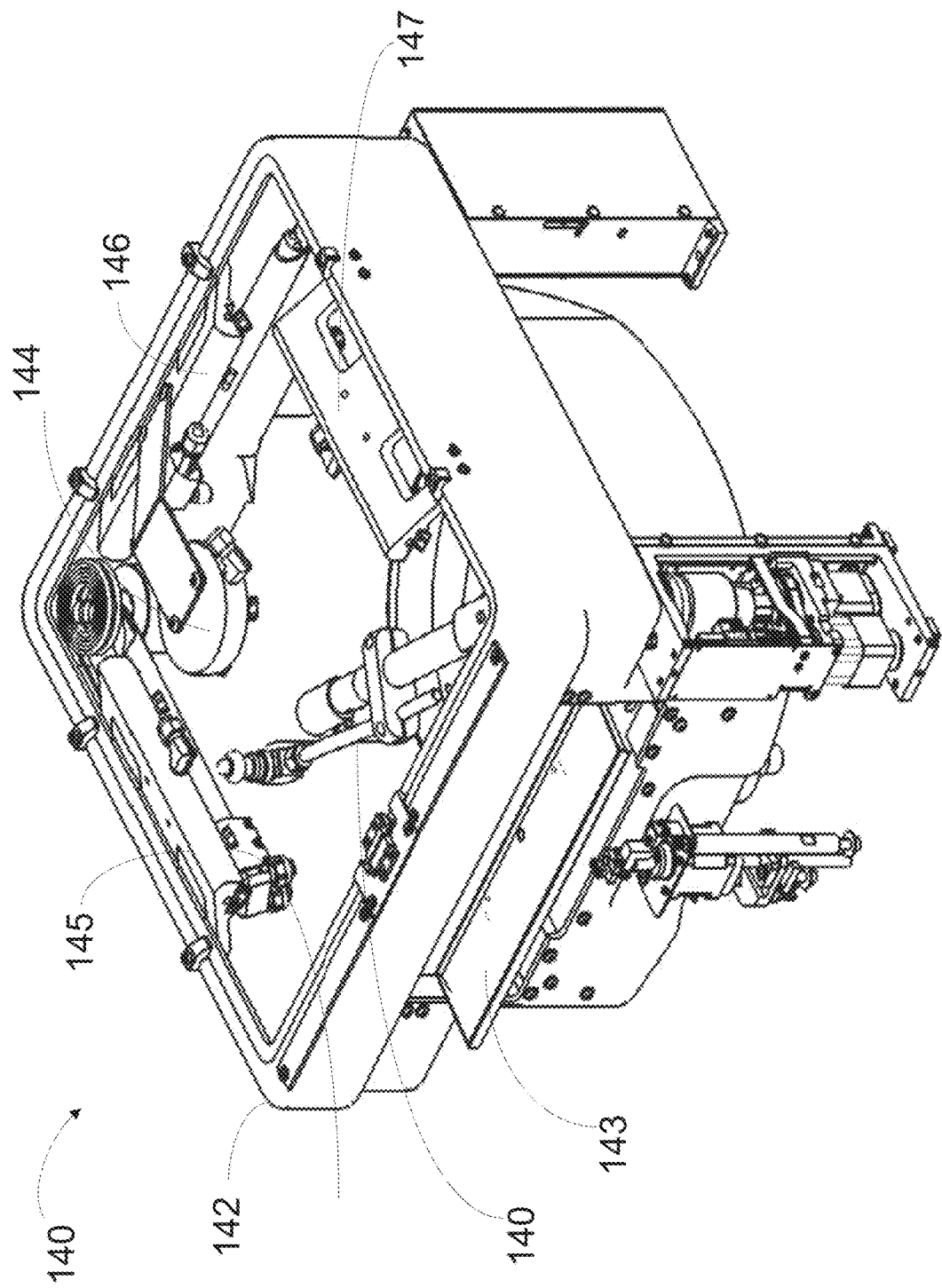
FIG. 8 is a perspective view of an embodiment of a self-cleaning lift-off station according to an embodiment of the present invention.
Figure 9:
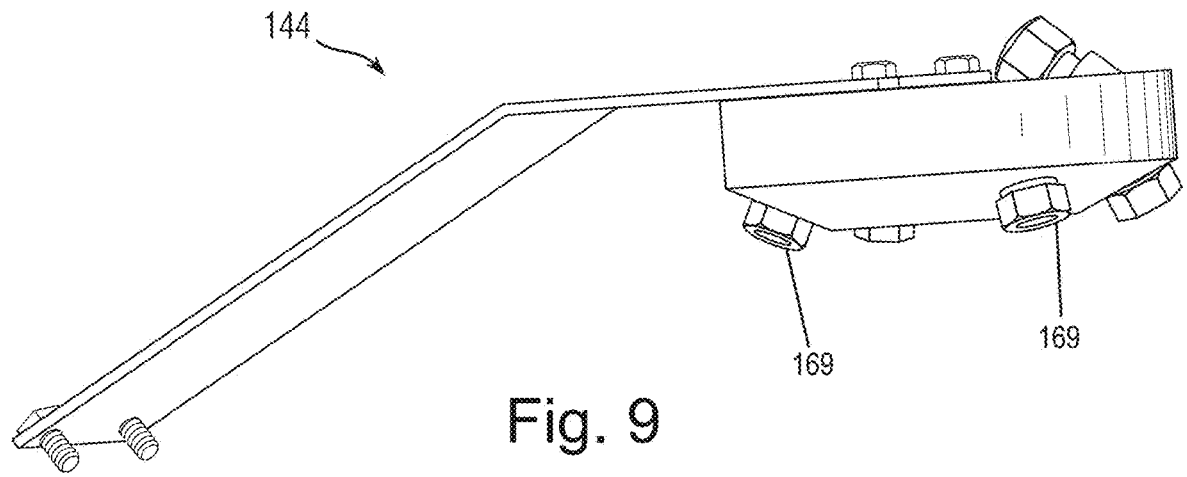
FIG. 9 is a perspective view of an embodiment of an overhead shower sprayer that may be used in a self-cleaning lift-off station according to the present invention.
Figure 10:
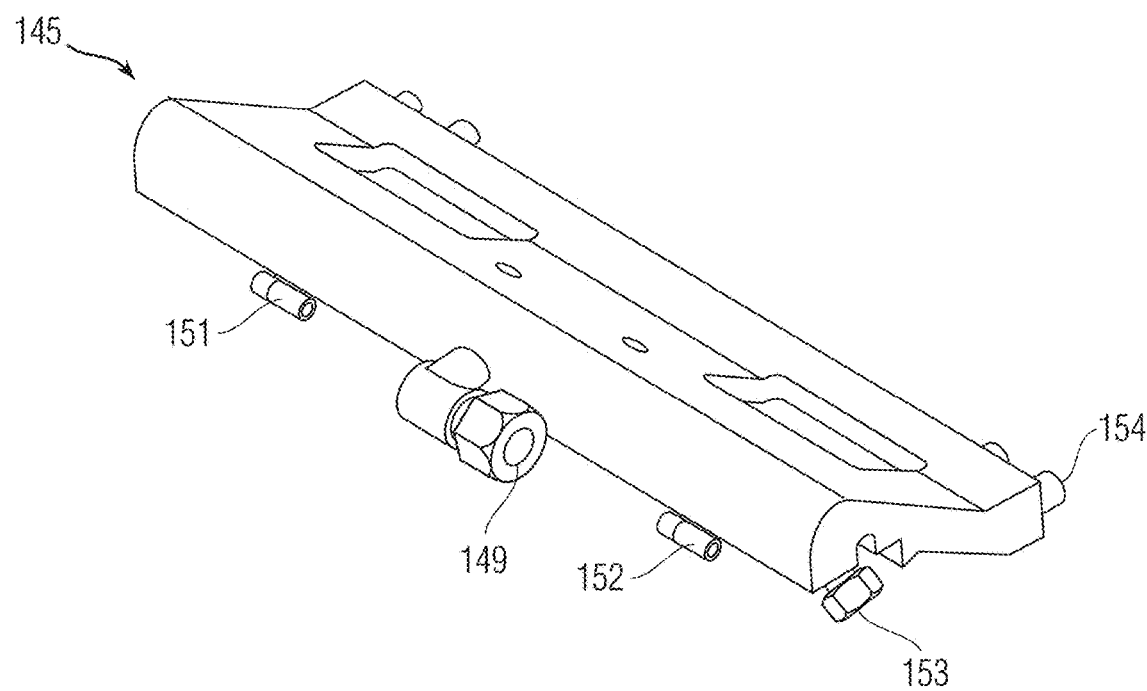
FIG. 10 is a perspective view of an embodiment of a nozzle manifold that may be used in a self-cleaning lift-off station according to the present invention.

The immersion process causes photoresist layers to swell, and serves as a preparation for a material lift-off process which takes place in the lift-off station, to which wafers are transferred by the robot arm after immersion. In the lift-off station, metal or other materials deposited over a resist layer are "lifted-off" and removed from the wafer. FIG. 8 shows an embodiment of a self-cleaning lift-off station 140 according to an embodiment of the present invention. The station 140 comprises a rectangular chamber 142 having a number of different spray devices for lifting-off metal and/or other material from photoresist layers from wafer surfaces and for thoroughly cleaning the inner surfaces of the chamber. At the front of the chamber 142 is a door 143 through which wafers are transferred into an out of the chamber. An overhead shower sprayer 144 is positioned toward the top of chamber, for example, by a cantilevered coupling as shown, and includes a plurality of spray nozzles 169 (e.g., 3, 4, 5, etc.) positioned around the perimeter of a fixture, which may be circular in shape as shown, or have other shapes. The nozzles 169 can also be adjustable in that they can pivot to allow the spray direction to be slightly altered. An exemplary embodiment of an overhead shower sprayer 144 is shown in FIG. 9. Additional pivotable nozzle manifolds 145, 146, 147 are positioned on three inner walls of the chamber. An exemplary embodiment of one of the nozzle manifolds, e.g., 145 is shown in FIG. 10. The manifold 145 has a fluid inlet 149 arranged on an upwardly tilted front surface, a plurality of nozzles, e.g., 151, 152 arranged on a bottom surface front and one or more nozzles arranged on side 153, and back surfaces 154. The nozzle manifolds, having a large number of nozzles arranged on different surfaces and at various angles, are configured to apply a rinse spray over a wide area of the chamber 142 and cover as much inner surface area as possible. The nozzles 151, 152 can be capped in they are not in-use. The manifolds 145, 146, 147 can have the same structure and as shown, can be arranged along one side of the rectangular chamber 142.

Figure 16:
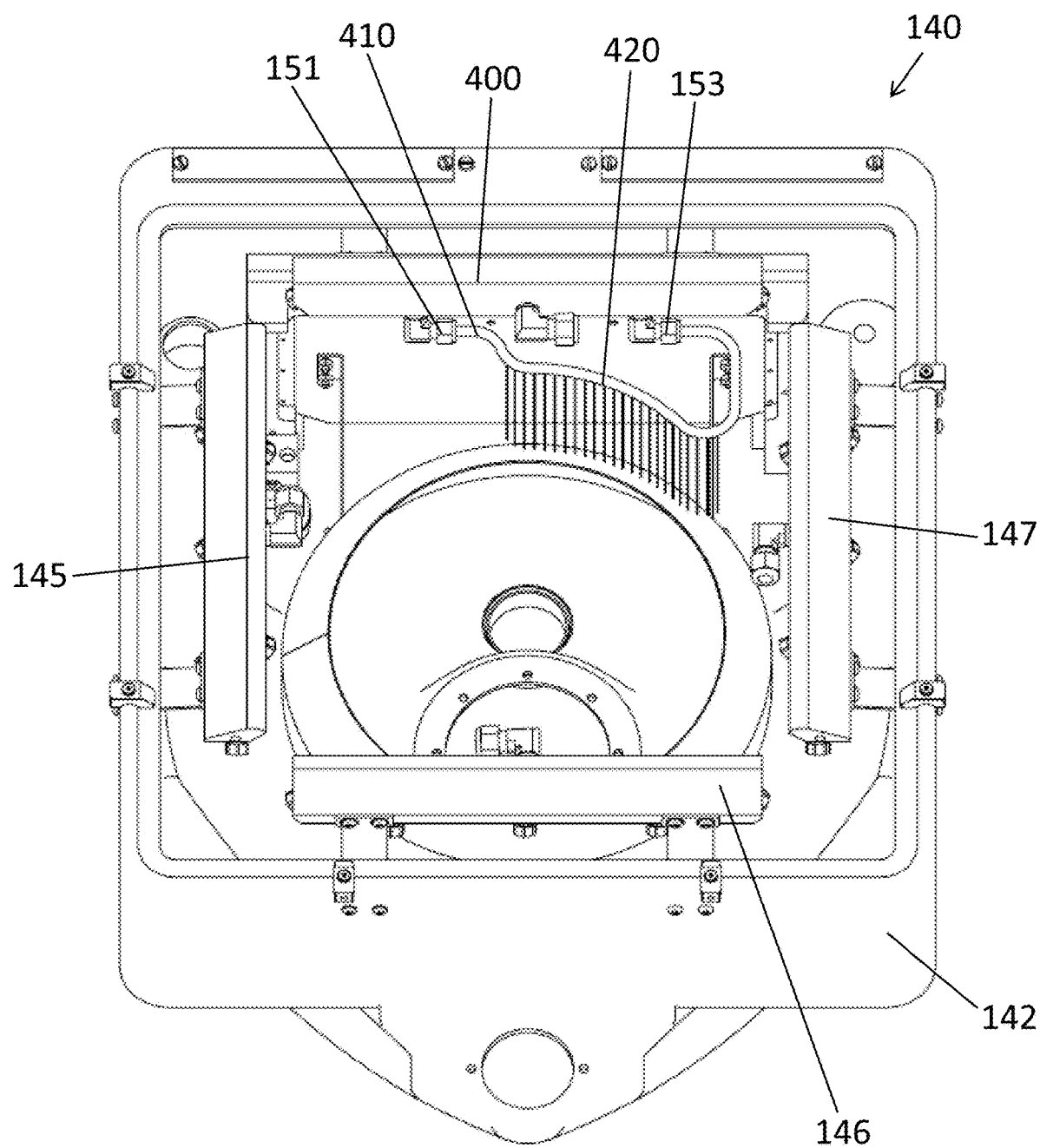
FIG. 16 is a top perspective view of a self-cleaning immersion station according to another embodiment of the present invention. In the view, the top portion of the housing has been removed.

Alternatively, one of the manifolds 145, 146, 147 can also be used as part of a spray mechanism for spraying a splash shield 148 that is part of self-cleaning lift-off station 140. As is known, the splash shield 148 is a structure that surrounds a substrate (e.g., wafer chuck) on which the wafer rests. The splash shield 148 is annular shaped as shown and many times, can be raised or lowered. More specifically, a manifold 400 can be provided that has a similar or the same structure as the manifolds 145, 146, 147 and therefore, like elements are numbered alike. The main difference is that the manifold 400 includes an elongated spray element 410 that has a conduit form and has a first end that is sealingly coupled to the nozzle 151 and the opposite second end that is sealingly coupled to the nozzle 153. The elongated spray element 410 has a bent structure so as to protrude inwardly toward the center of the rectangular chamber 142 and more specifically, the elongated spray element 410 has an arcuate section 420 that is positioned above an arcuate segment of the splash shield 148. Along an underside of the elongated spray element 410, there is a plurality of holes (spray holes) through which the liquid spray is discharged in a downward direction toward the splash shield 148. The elongated spray element 410 can thus be in the form of a rinse tube for cleaning the top of the splash shield 148. In FIG. 16, the downward spray pattern is shown by the series of parallel lines extending from the underside of the elongated spray element 410 to the splash shield 148 for cleaning thereof. In combination with the other spray systems described herein, including the spray system shown in FIGS. 17 and 18, optimal spray coverage within the rectangular chamber 142 is achieved.

Figure 11:
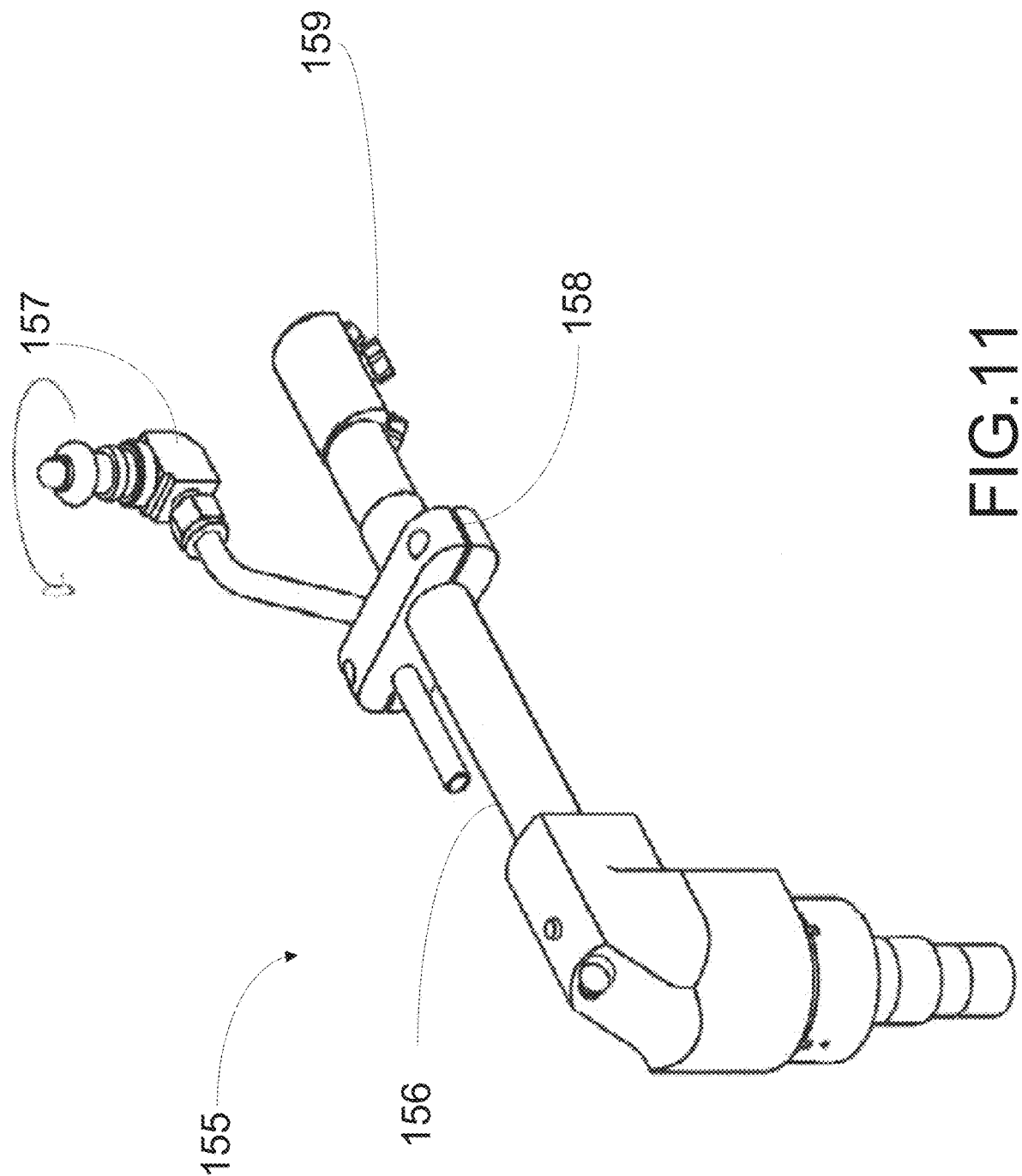
FIG. 11 is a perspective view of an embodiment of a swivel sprayer that may be used in a self-cleaning lift-off station according to the present invention.
Figure 18:
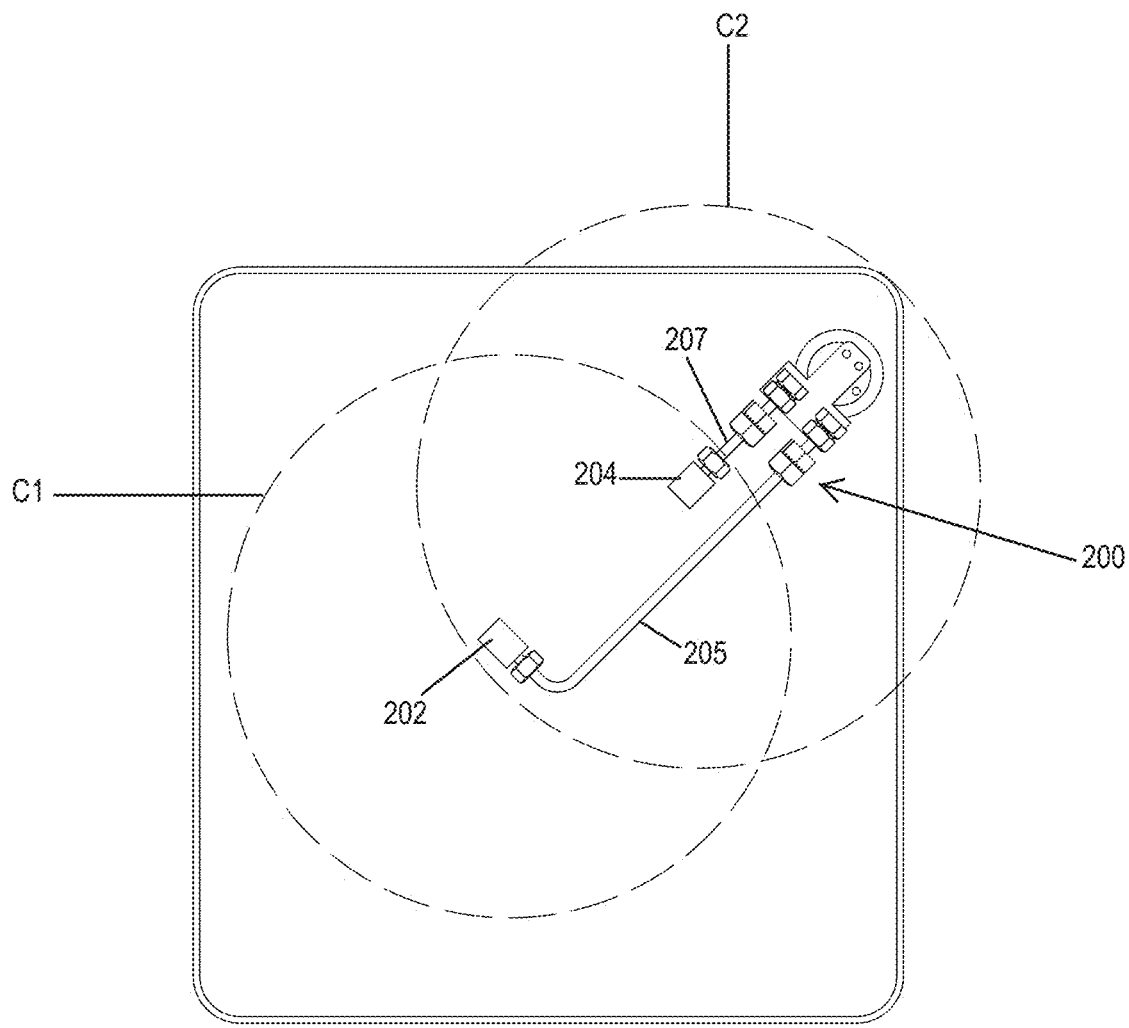
FIG. 18 is a top plan view of a self-cleaning immersion station with the dual swivel sprayer of FIG. 17 in an in-use position with the spray coverage of each sprayer head being depicted.

In addition to the shower spray and side nozzle manifolds, the lift-off station preferably includes a swivel sprayer 155 coupled to an arm 156 that pivots in the horizontal plane (in the other words, the arm 157 can rotate about a pivot axis so as to position the arm 156 in a desired location which can be a location that is directed inward towards a center of the equipment housing as described with reference to FIG. 18. FIG. 11 is a perspective view of an exemplary embodiment of swivel sprayer 155 and shows a rotating spray head 157 joined via collar 158 to one or more spray nozzles 159 positioned at the end of the pivotable arm 156. Rotating spray head 157 can be implemented using a commonly-available landscape sprayer that provides a full 360° spray. In other words, the spray coverage of the head 157 is generally a circle of a given diameter which depends on the construction of the nozzle of the head 157. The combination of sprayers is designed to be able to direct sprays of cleaning for to all of the wall surfaces and components within the chamber 142. In alternative aspects, more or less sprayers can be provided in any suitable combination to remove material deposited on surfaces within the chamber. It will be appreciated that the rotating spray head 157 is positioned so as to spray upward, while the one or more spray nozzles 159 spray downward.

Figure 17:
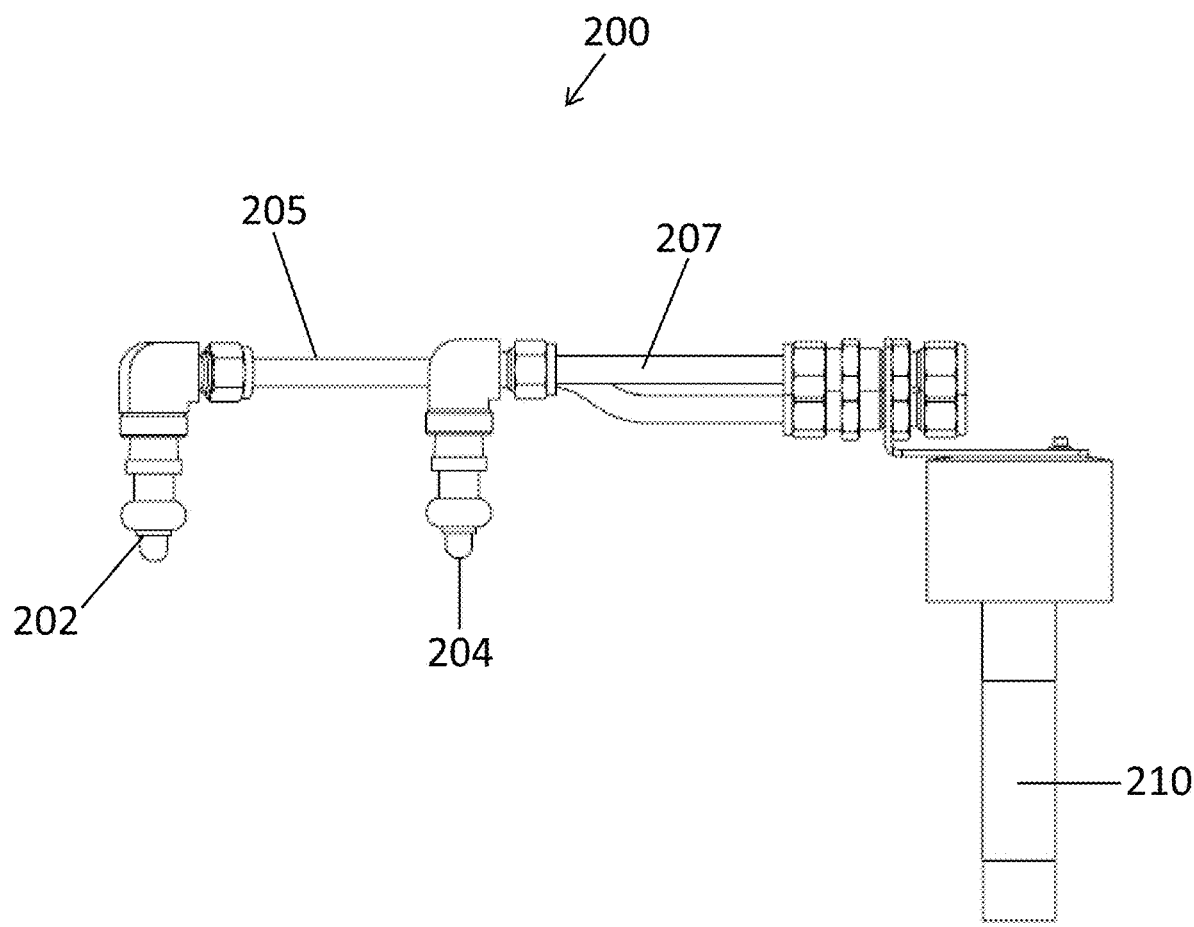
FIG. 17 is a perspective view of another embodiment of a dual swivel sprayer that may be used in a self-cleaning lift-off station according to the present invention.

The swivel sprayer 155 of FIG. 11 can be thought of as being a single swivel sprayer since it includes a single rotating spray head 157. In contrast, FIGS. 17 and 18 illustrate a dual swivel sprayer that includes a pair of rotating spray heads and does not includes the one or more spray nozzles 159 shown in FIG. 11. More specifically, a swivel sprayer 200 is shown in FIGS. 17 and 18 that is similar to the swivel sprayer 155 but includes the aforementioned differences and more particularly, the swivel sprayer 200 pivots in the horizontal plane (so as to have a sweeping action). The swivel sprayer 200 includes a first rotating spray head 202 and a second rotating spray head 204. The first rotating spray head 202 and the second rotating spray head 204 can be similar to the rotating spray head 157 and thus, each is configured to spray liquid in a 360 degree spray pattern. The first and second rotating spray heads 202, 204 can be the same type of head in that they each have the same 360 degree spray pattern (i.e., they spray a circle having a prescribed diameter). The first rotating spray head 202 has a first fluid conduit formed in a first arm 205 for delivering fluid to the head 202 and the second rotating spray head 204 has a second fluid conduit formed in a second arm 207 for delivering fluid to the head 204. The two conduits are maintained separately. As shown in FIG. 17, the first rotating spray head 202 can be located a first distance (first radius) from a vertical post 210 from which the arms 205, 207 extend and the second rotating spray head 204 is located a second distance from the vertical post 210, with the first distance being greater than the second distance. The arms 205, 207 and heads 202, 204 rotate about the vertical post 210. Both heads 202, 204 point down to project the sprayed liquid downward. FIG. 18 shows the swivel sprayer 200 in an in-use position in which the arms 205, 207 are positioned inwardly and centrally within the housing (e.g., at a location over the wafer chuck). The spray patterns of the heads 202, 204 are selected such that the two circular spray patterns, labeled C1 and C2, at least partially overlap as shown and when combined, the two circular shaped spray coverage covers a substantial inside area of the housing (station), thereby ensuring that the equipment and associated surfaces are cleaned. As will also be appreciated in view of FIG. 18, the arms 205, 207 are laterally spaced apart from one another and can be straight in shape or as shown, the distal end portion of the arm 205 can be curved (bent). It will be understood that the spray coverage shown in FIG. 18 is merely exemplary and the sizes and location of the circles can vary depending on the type of spray heads and other parameters, such as tank size, etc. As mentioned, when the spray heads 202, 204 have the same 360 spray coverage, the circles C1 and C2 depicting said spray coverage should have the same diameter. Any portion of the housing that is not within the spray coverage of C1, C2 can be addressed using another spray device, such as the ones described herein. In this way, with two or more sprayers, complete spray coverage within the housing is achieved.

Figure 12A:
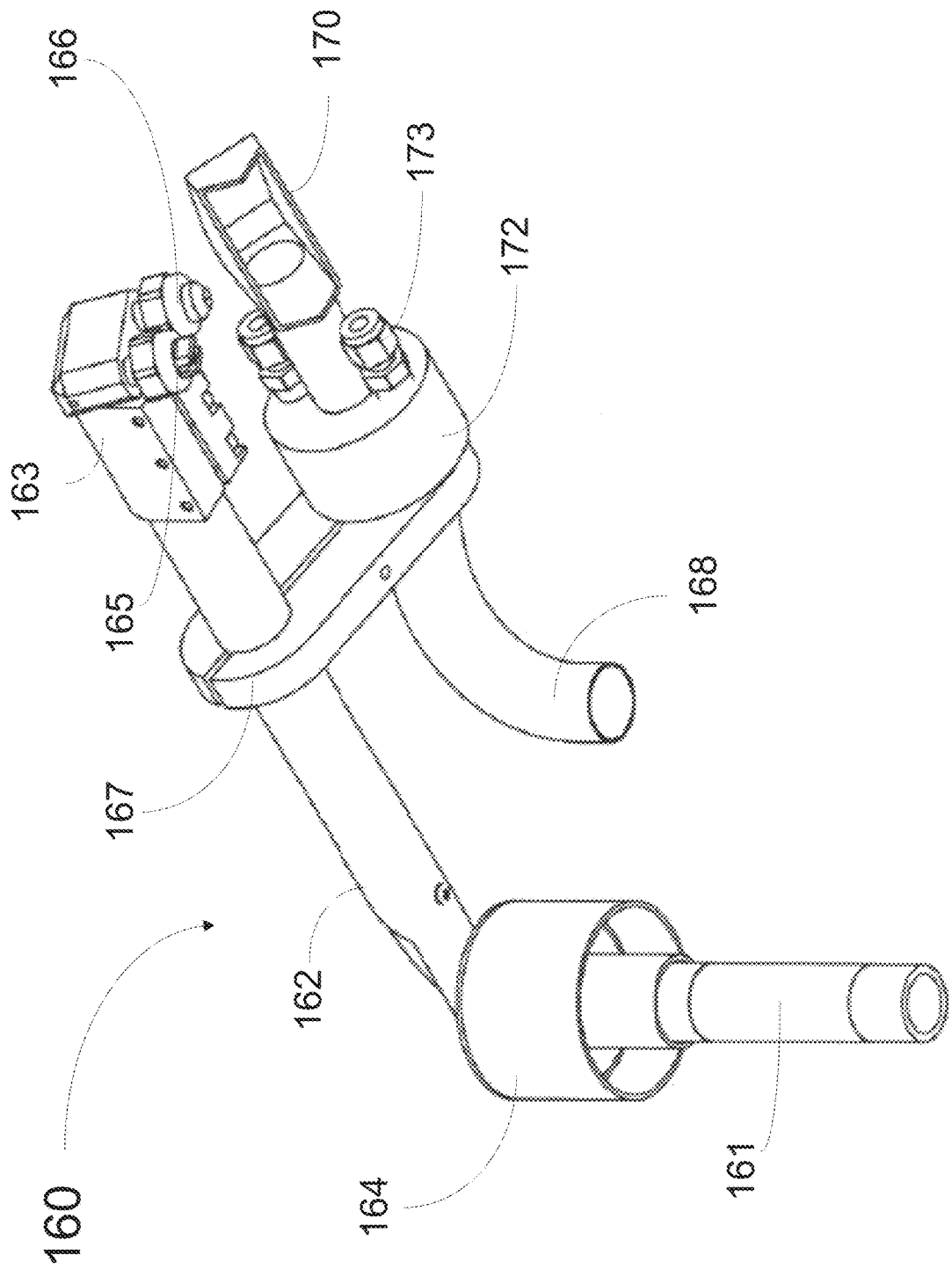
FIG. 12A is a bottom perspective view that shows an embodiment of a vacuum-assisted separator sprayer according to the present invention.

Embodiments of the self-cleaning lift-off station according to present invention can also include a useful feature for entirely removing debris that might otherwise clog filters or adhere to wafer and chamber surfaces. A vacuum-assisted separator sprayer 160 is positioned with spray end positioned toward the front of the chamber near door 143. FIG. 12A is a bottom perspective view that shows the vacuum-assisted separator 160 sprayer in greater detail. As shown, a main arm 161 is attached to an arm drive (not shown). The main arm 161 makes an elbow turn or coupling to a distal arm 162 that holds a dispense head 163. A skirt 164 encircles the elbow joint where the main arm 161 and distal arm 162 join in order to prevent fluids from entering the arm drive. The dispense head includes first and second nozzles 165, 166. In some implementations, first nozzle 165 is adapted to generate a fan spray, and nozzle 166 is adapted to generate a needle spray, or vice versa. In other embodiments, nozzles 165, 166 can be adapted to generate the same type of spray or sprays other than a fan and needle spray. Preferably solvent is supplied to nozzles 165, 166 at high pressure to provide enough force to dislodge the metal or other material film and underlying resist from wafer substrates during a lift-off process.

In the embodiment depicted, a collar 167 is coupled to the distal arm 162 as well as to a suction conduit 168. A suction head 170 coupled to the suction conduit 168 is positioned adjacent to the dispense head. In the depicted embodiment, the suction head 170 is adapted to generate a vacuum suction force by a Venturi body 172 coupled to a nitrogen supply line via nitrogen inlet 173. Within Venturi body 172, nitrogen gas is forced into a narrow passageway from a larger passageway, which as is known in the art, generates a high-speed flow and a pressure differential in a direction perpendicular to the gas flow. The suction head 170 includes an inlet 175 that is positioned to draw in, via the suction force generated by the Venturi body 172, material dislodged by the high-pressure sprays generated by the nozzles 165, 166 at the dispense head 163. Lift-off materials, some solvent from the wafer surface and some amount of air that is entrapped by the suction force enters the inlet and flows through the suction conduit to a drain (not shown in FIG. 12A). The rapid removal of the debris into the suction conduit not only prevents the accumulation of the debris within the station chamber 142, but also prevents the debris from being dragged along the surface of the wafer.

Figure 12B:
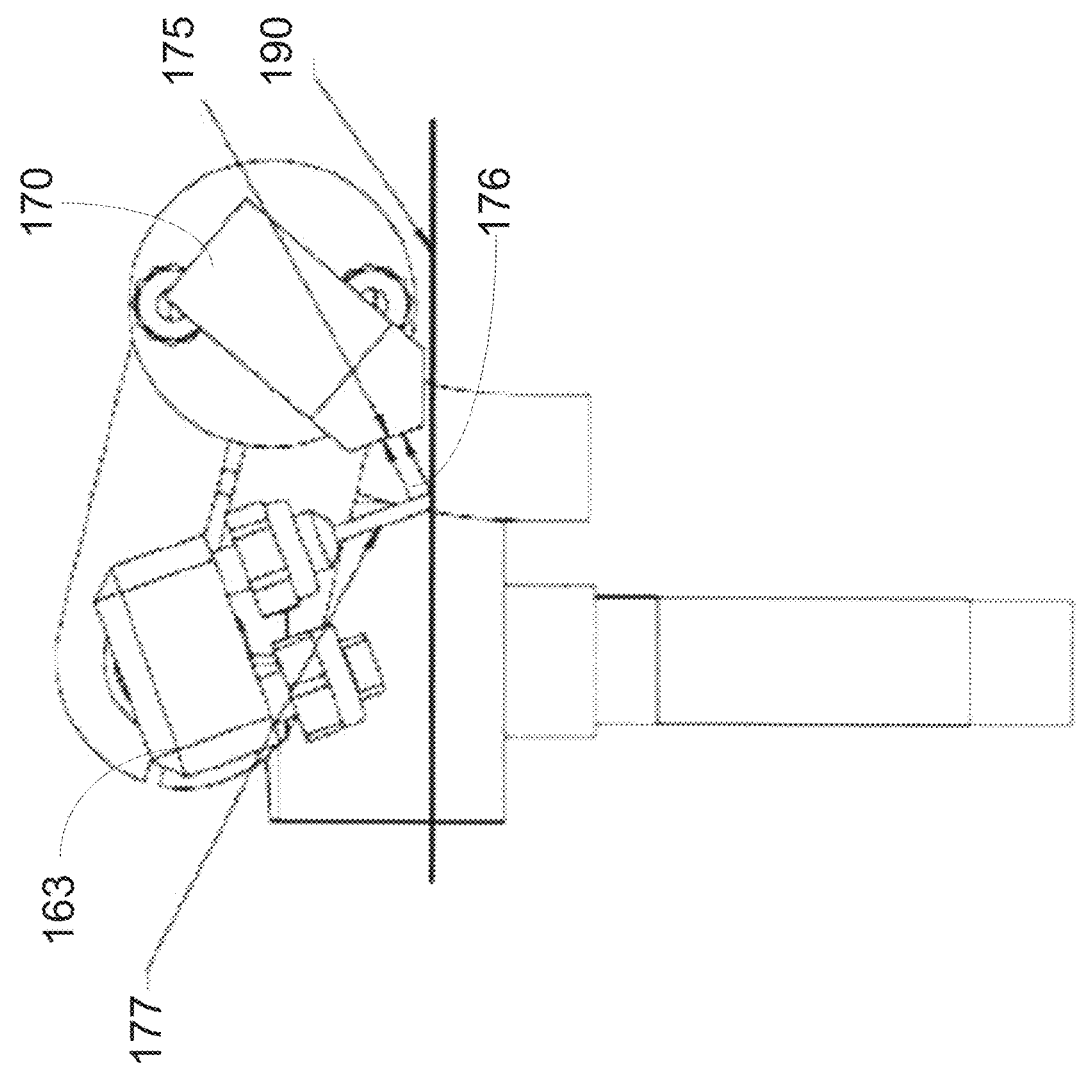
FIG. 12B is an end view of an embodiment of a vacuum-assisted separator sprayer according to the present invention.
Figure 12C:
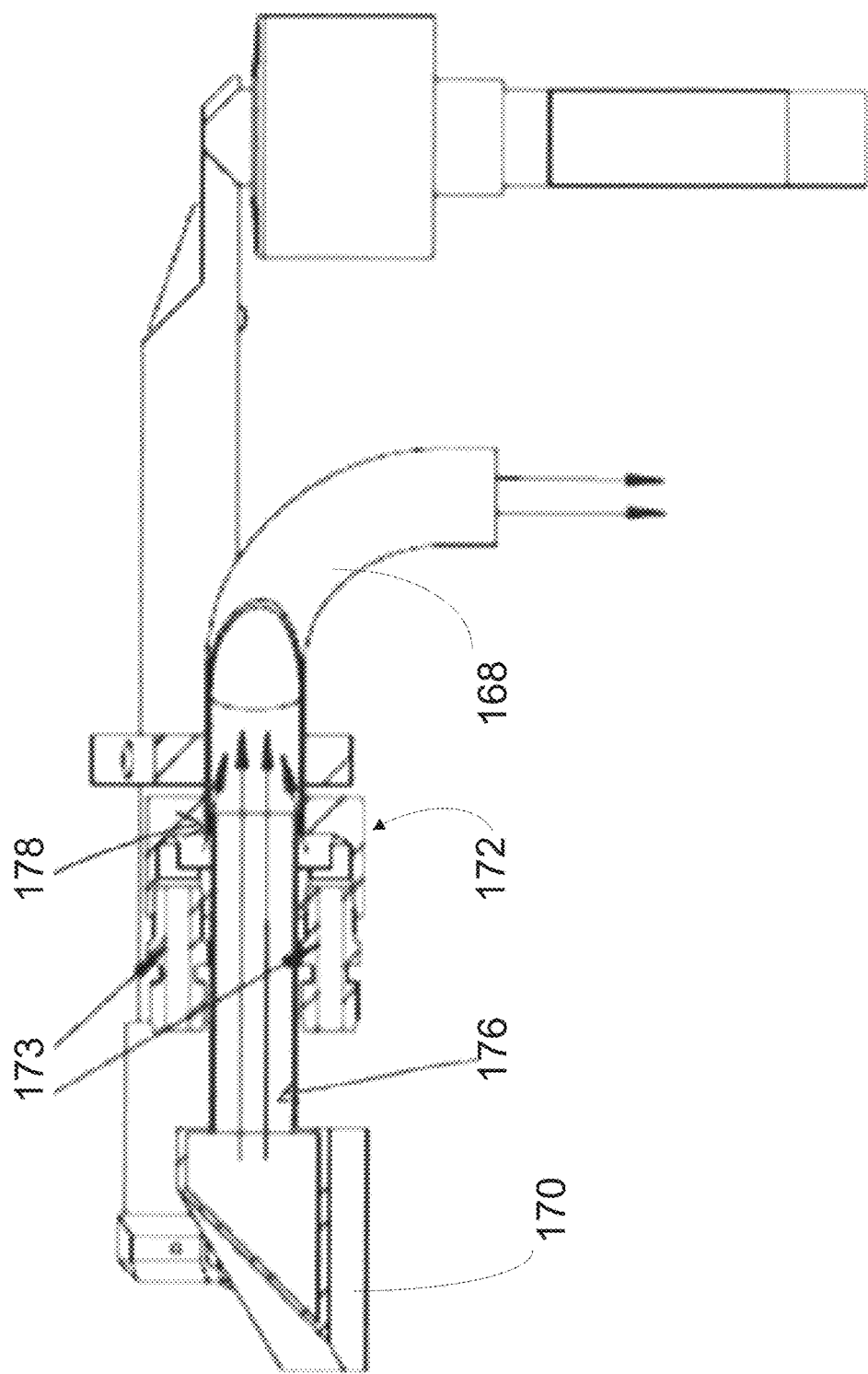
FIG. 12C is a cross-sectional view of the vacuum-assisted portion of the separator sprayer according to an embodiment of the present invention.

FIG. 12B is an end view of the vacuum-assisted separator which illustrates a jet of high-pressure solvent 177 emitted from a nozzle 166 impacting a wafer 190. As shown, fluid and lift-off material is captured by the suction force and enters the inlet 175 of suction head 170. FIG. 12C is a cross-sectional view of the vacuum-assisted portion of separator 160. This view shows nitrogen inlet 173 of the Venturi body and the narrow opening 178 through which the nitrogen is forced to generate the high-speed flow and pressure differential. The suction flow 176 is shown by arrows within the suction conduit 168. Air, nitrogen, lift-off material and solvent exits the suction conduit toward a drain.

Figure 13:
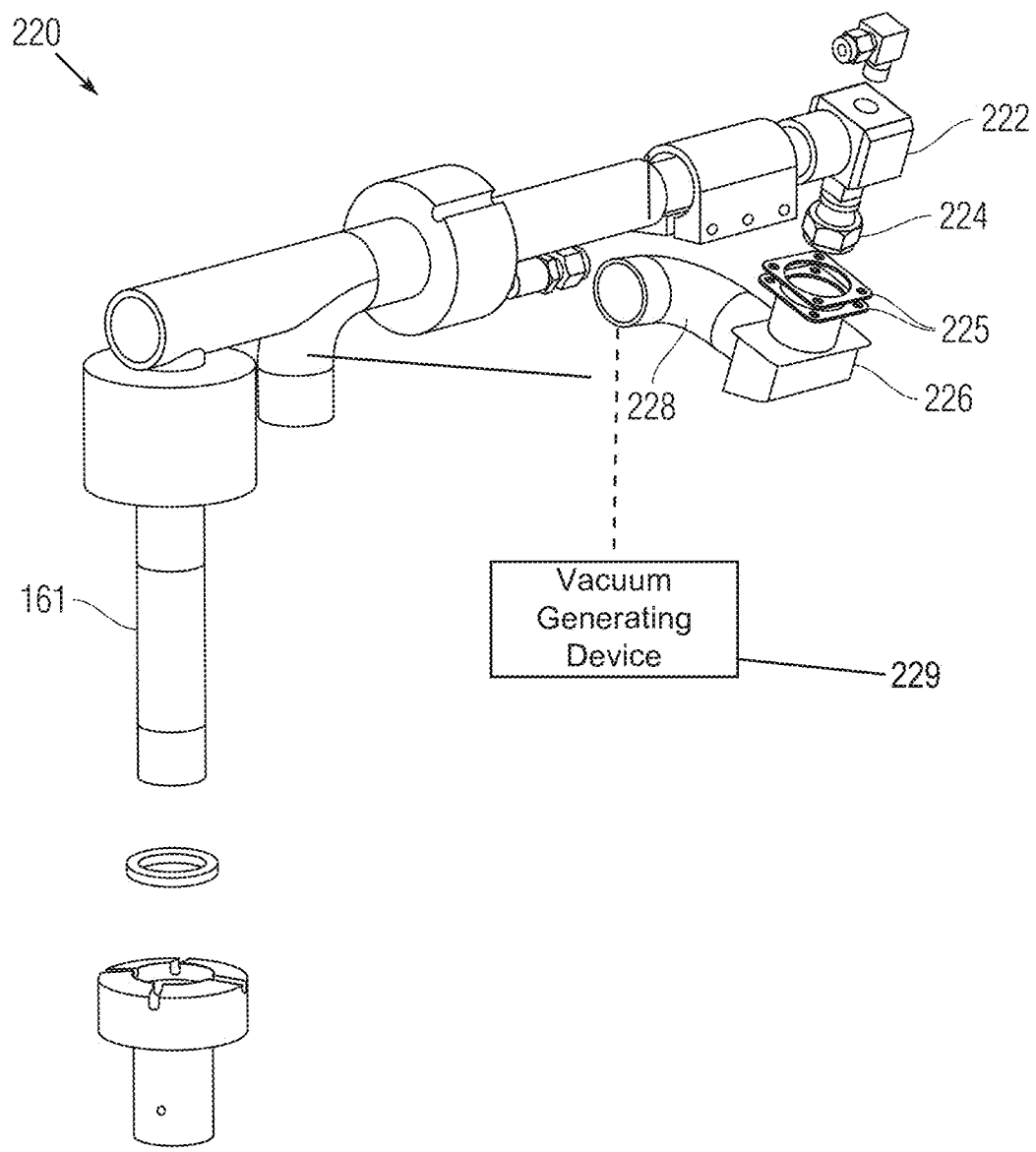
FIG. 13 is a perspective view of an alternative embodiment of a vacuum-assisted separator according to the present invention

FIG. 13 is a perspective view of an alternative embodiment of a vacuum-assisted separator 220 according to the present invention. The separator includes a coiled supply line that provides pressurized solvent to a dispense head 222 including a fan nozzle 224. The end of the nozzle 224 is coupled to a first side of spacer 225, and the second side of the spacer 225 is coupled to a suction head 226. According to this arrangement, the nozzle 224 is in line with and directs spray through the suction head 226. Suction head 226 has a main opening at the bottom through which spray can be directed onto a wafer surface, and includes a side opening into a suction conduit 228 that is coupled to a vacuum source. In this embodiment, a Venturi body is not directly coupled to the suction head 226, rather, the suction conduit 228 is coupled to a downstream blower or other conventional vacuum-generating device 229. In operation, when the high-pressure spray of nozzle 224 impacts the wafer, lift off material is forcibly ejected upwardly from the surface into the suction head 226 and becomes entrained by the suction emanating from the suction conduit at side exit of the suction head. The material is drawn off through the suction conduit to a drain (not shown).

FIG. 14A is a magnified schematic illustration of how the vacuum-assisted separator aids in drawing debris from the wafer surface into a suction path, which aids in preventing build-up of residual material in the lift-off station. As shown, a nozzle 165 is enveloped within a suction head which is cut at an angle so that both the suction head main opening 230, and the adjacent opening 232 to the suction conduit through which suction is applied, are positioned near to the surface of a wafer 190. When the nozzle 165 directs a fan of high-pressure solvent spray toward the surface of a wafer 190, the spray forcibly breaks off and atomizes the lift-off material. The overwhelming majority particles of debris 233 that is dislodged from the wafer surface enters and becomes entrained in the suction flow within the suction head, due to the close positioning of the suction head and applied vacuum to the wafer surface.

FIG. 14B is a schematic illustration of debris removal using a vacuum-assisted separator that employs a Venturi body 172. Debris that is removed from the wafer 190 positioned within a chamber is drawn into the main opening of suction head 170 by the suction generated by nitrogen gas flow in the Venturi body. The suction conduit delivers the debris to a drain 240 that flows into a tank 245 with a filter 247. FIG. 14C is a schematic illustration of debris removal using a vacuum-assisted separator that employs a blower 250 to generate suction. In this embodiment, suction is generated from a blower that is fluidly coupled to the suction head via a tank 255. Debris drawn through the suction head is similarly drawn through a conduit into a filter 257 positioned in the tank. These embodiments illustrate how rather than being ejected into the spaces and surfaces within the lift-off chamber, embodiments of the vacuum-assisted separator redirect lift-off debris into a drain and filter. The amount of debris that accumulates on the internal surfaces of the chamber is thereby reduced. Furthermore, any debris that is not captured by the vacuum-assisted separator can be washed from the internal surfaces by the numerous cleaning sprays employed in the lift-off station according to the embodiments of the present invention.

Figure 15:
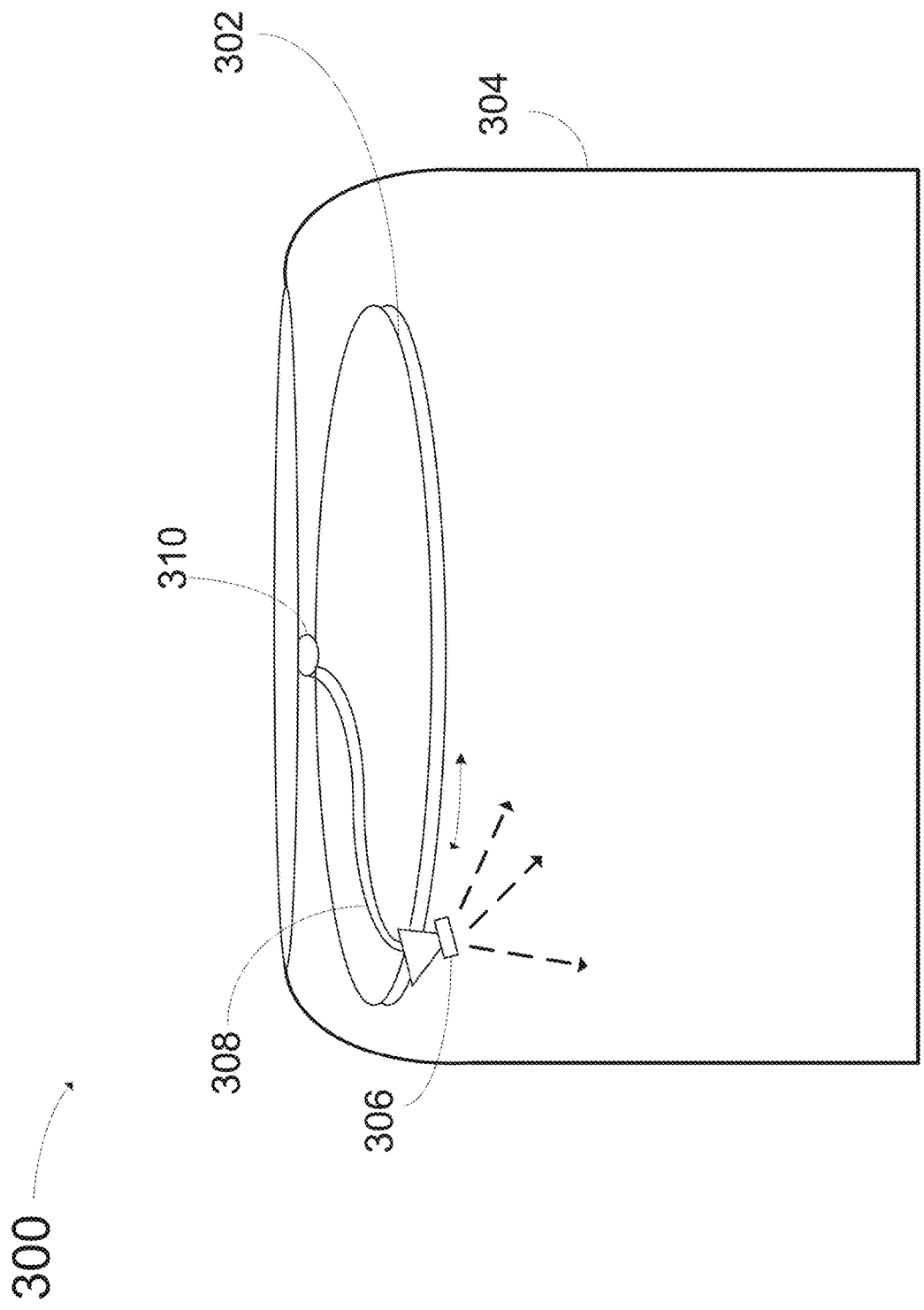
FIG. 15 is a front view of an embodiment of an overhead track rinse sprayer that may be used in in a self-cleaning lift-off station according to the present invention.

FIG. 15 is a front view of an overhead track sprayer device 300 that may be used in embodiments of a lift-off station according to the present invention. The device includes a circular or elliptical track system 302 that may be attached to roof or dome of the station chamber 304. A nozzle 306 is positioned on the track and receives fluid from tubing 308 that may run through a seal 310 attached to the chamber and to a cleaning fluid supply source. The tubing swivels the nozzle 360° around the track by the force of the high-pressure fluid within the tubing. The swiveling allows the nozzle to cover the inner surfaces of the chamber with cleaning fluid to remove debris and leftover solvents. In some embodiments, the tubing 308 can run from a valve to a fast-acting disconnect. A sealed swivel fitting at the center of the track 302 can be used to provide full rotation of the tubing 308 without twisting or kinking. The tubing 308 can be attached to the track 302 using rollers to reduce friction and provide consistent rotation.

It is to be understood that any structural and functional details disclosed herein are not to be interpreted as limiting the system and methods, but rather are provided as a representative embodiment and/or arrangement for teaching one skilled in the art one or more ways to implement the methods.

It is to be further understood that like numerals in the drawings represent like elements through the several figures, and that not all components and/or steps described and illustrated with reference to the figures are required for all embodiments or arrangements The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing and are not to be construed as limiting. However, it is recognized these terms could be used with reference to a viewer. Accordingly, no limitations are implied or to be inferred.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the invention has been described with reference to exemplary embodiments, it will be understood by those skilled in the art that various changes can be made and equivalents can be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention is not limited to the particular embodiment disclosed as the best mode contemplated for carrying out this invention, but that the invention will include all embodiments falling within the scope of the appended claims.

What is claimed is:

1. A semiconductor processing system comprising:
a self-cleaning immersion station having a housing adapted for immersion of a wafer in solvent for removal of material, the immersion station including a first sprayer having a plurality of nozzles positioned to spray the wafer as it is transferred out of the immersion station, and a self-cleaning assembly adapted to spray cleaning fluid on internal surfaces of the immersion station, wherein the housing of the immersion station includes an opening located along one side of the housing through which the wafer can be removed from inside housing of the immersion station, the first sprayer comprising an elongated bar that is disposed proximate the opening and configured to spray downward onto the wafer, the first sprayer being pivotally mounted relative to the housing and being positionable such that the elongated bar extends longitudinally next to the opening of the housing so that when the wafer is removed through the opening, the wafer passes below the elongated bar; and
a self-cleaning lift-off station adapted to completely remove material from the surface of the wafer and including a) a vacuum-assisted separator adapted to spray solvent at a high pressure spray onto the wafer surface while applying suction in the vicinity of the sprayed wafer surface to capture material dislodged by the spray, and b) at least one cleaning sprayer adapted to clean internal surfaces of the lift-off station.

2. The semiconductor processing system of claim 1, wherein one or more of the plurality of nozzles of the first sprayer are configured to independently pivot relative to the elongated bar to which the plurality of nozzles are mounted.

3. The semiconductor processing system of claim 1, wherein the plurality of nozzles of the first sprayer comprises fan nozzles that are arranged linearly across a width of the opening.

4. The semiconductor processing system of claim 3, wherein the fan nozzles define a total spray coverage that is at least equal to a diameter of the wafer.

5. The semiconductor processing system of claim 1, wherein the self-cleaning immersion station includes an upper housing having a door through which wafers are received, and a solvent tank coupled to a bottom of the upper housing, and wherein the self-cleaning assembly includes a plurality of fan nozzles positioned within the solvent tank and adapted to direct wide-angle sprays of cleaning fluid onto internal surfaces of the tank.

6. The semiconductor processing system of claim 5, wherein the solvent tank has a slopped floor that leads to a drain and the plurality of fan nozzles are connected with a common fluid delivery conduit.

7. The semiconductor processing system of claim 6, wherein the fan nozzles have nozzle heads that are located in different horizontal planes and point in different directions relative to one another.

8. The semiconductor processing system of claim 1, wherein the at least one cleaning sprayer of the lift-off station includes an overhead sprayer that has an arm that projects inwardly toward a center of the lift-off station and a base portion at a distal end of the arm that includes a plurality of nozzles facing downward toward a floor of the lift-off station.

9. The semiconductor processing system of claim 1, wherein the at least one cleaning sprayer of the lift-off station includes a plurality of nozzle manifolds that are each pivotally mounted to a side wall of the lift-off station to allow the nozzle manifold to be raised and lowered relative to a floor of the lift-off station, each nozzle manifold having one or more spray nozzles.

10. The semiconductor processing system of claim 9, wherein at least one of the nozzle manifolds includes an elongated conduit that has an arcuate shaped segment for positioning above a splash shield of the lift-off station, the arcuate shaped segment having a plurality of holes along an underside for discharging fluid to the splash shield for cleaning thereof.

11. The semiconductor processing system of claim 9, wherein the elongated conduit has a first end and a second end that attach to the nozzle manifold.

12. The semiconductor processing system of claim 1, wherein the at least one cleaning sprayer further comprises a pivotable sprayer with a rotating spray head, the rotating spray head covering a full 360 degrees of rotation.

13. The semiconductor processing system of claim 1, wherein the at least one cleaning sprayer further comprises a pivotable sprayer with dual rotating spray heads, each rotating spray head covering a full 360 degrees of rotation.

14. The semiconductor processing system of claim 13, wherein each of the dual rotating spray heads is disposed along an arm, with the arms having different lengths so as to axially offset the dual rotating spray heads resulting in spray coverages in the form of two circles that partially overlap.

15. The semiconductor processing system of claim 1, wherein the vacuum-assisted separator of the self-cleaning lift-off station includes a suction head having a Venturi body for generating suction for capturing material dislodged by the spray.

16. The semiconductor processing system of claim 15, wherein the vacuum-assisted separator includes an arm that is pivotable relative to the lift-off station and has a dispense head at a distal end thereof, the dispense head including one or more nozzles that face downward, the suction head being spaced laterally from the arm and coupled thereto with a connector.

17. The semiconductor processing system of claim 16, wherein the venturi body has a nitrogen inlet that channels nitrogen gas through the venturi body for generating the suction within the suction head.

18. The semiconductor processing system of claim 16, wherein the suction head is angled towards the dispense head and the dispense head is angled towards the suction head.

19. The semiconductor processing system of claim 18, wherein the one or more nozzles of the dispense head are located above an inlet of the suction head resulting in the inlet of the suction head being closer to the wafer.

20. The semiconductor processing system of claim 1, wherein the vacuum-assisted separator of the self-cleaning lift-off station includes a suction head coupled to a blower located distally from the separator for generating suction for capturing material dislodged by the spray.

21. The semiconductor processing system of claim 1, wherein the vacuum-assisted separator includes a dispense head and a separate suction head that is spaced from the dispense head and has an opening facing a fluid discharge axis that passes through the dispense head and is the axis along which the fluid is discharged.

22. The semiconductor processing system of claim 1, wherein the vacuum-assisted separator includes a dispense head and a separate suction head that are arranged along a common axis with the dispense head being upstream of the suction head such that fluid from the dispense head is discharged through the section head for contacting the wafer below the suction head.

23. The semiconductor processing system of claim 22, wherein the suction head has a side opening to which suction is applied and has a top opening through which the dispense head is disposed for discharging fluid downwardly through the suction head.

24. The semiconductor processing system of claim 1, wherein the housing of the self-cleaning immersion station includes a first wafer sensor that is located a first distance from the opening and a second wafer sensor that is located a second distance from the opening, the second distance being greater than the first distance, each of the first wafer sensor and the second wafer sensor is configured to emit a light beam across the housing in a direction that is parallel to a longitudinal direction of the opening formed in the housing, each of the first wafer sensor and the second wafer sensor being configured to defect a presence of the wafer.

25. A semiconductor processing system comprising:
a self-cleaning immersion station adapted for immersion of a wafer in solvent for removal of material, the immersion station including a first sprayer having a plurality of nozzles positioned to spray the wafer as it is transferred out of the immersion station, and a self-cleaning assembly adapted to spray cleaning fluid on internal surfaces of the immersion station; and
a self-cleaning lift-off station adapted to completely remove material from the surface of the wafer and including a) a vacuum-assisted separator adapted to spray solvent at a high pressure spray onto the wafer surface while applying suction in the vicinity of the sprayed wafer surface to capture material dislodged by the spray, and b) at least one cleaning sprayer adapted to clean internal surfaces of the lift-off station, wherein the lift-off station includes a swivel sprayer that is pivotable and extends inwardly toward the center of the lift-off station, the swivel sprayer including a main arm that pivots relative to a housing of the self-cleaning lift-off station, the main arm pivoting about a pivot axis, the main arm terminating in a distal spray head that includes one or more spray nozzles that face downward toward the floor of the lift-off station for spraying in a downward direction, the swivel sprayer having a rotating spray head that is located at a distal end of a second arm that is bent such that the rotating spray head is located above both the main arm and the one or more spray nozzles located in the distal spray head, the rotating spray head being configured to rotate about a first axis and spray in an upward direction and along a circumferential pattern, the first axis and the pivot axis being spaced from one another.

26. The semiconductor processing system of claim 25, wherein the second arm is joined to the main arm by a collar such that a bottom segment of the second arm is laterally offset from and is oriented parallel to the main arm.

* * * * *